(12) United States Patent
Nishiyama et al.

(10) Patent No.: US 7,449,406 B2
(45) Date of Patent: Nov. 11, 2008

(54) SEMICONDUCTOR ELEMENT AND A PRODUCING METHOD FOR THE SAME, AND A SEMICONDUCTOR DEVICE AND A PRODUCING METHOD FOR THE SAME

(75) Inventors: Tomohiro Nishiyama, Tokyo (JP); Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 178 days.

(21) Appl. No.: 11/519,153

(22) Filed: Sep. 12, 2006

(65) Prior Publication Data

US 2007/0020912 A1    Jan. 25, 2007

Related U.S. Application Data

(62) Division of application No. 11/271,819, filed on Nov. 14, 2005, now Pat. No. 7,268,438, which is a division of application No. 10/359,124, filed on Feb. 6, 2003, now Pat. No. 7,135,770.

(30) Foreign Application Priority Data

Feb. 7, 2002    (JP)    ............................. 2002-030334

(51) Int. Cl.
H01L 21/00    (2006.01)
(52) U.S. Cl. .................. 438/612; 438/465; 438/613
(58) Field of Classification Search ................ 438/106, 438/465, 612, 613
See application file for complete search history.

(56) References Cited

U.S. PATENT DOCUMENTS

| 5,629,564 | A | 5/1997 | Nye et al. |
| 5,959,363 | A | 9/1999 | Yamada et al. |
| 6,107,164 | A | 8/2000 | Chuchi |
| 6,467,674 | B1 | 10/2002 | Mihara |
| 6,472,249 | B1 | 10/2002 | Kuwabara |
| 6,476,503 | B1 | 11/2002 | Imamura et al. |
| 6,541,366 | B1 | 4/2003 | Chin et al. |
| 6,596,618 | B1 | 7/2003 | Narayanan et al. |
| 6,600,234 | B2 | 7/2003 | Kuwabara et al. |
| 6,639,299 | B2 | 10/2003 | Aoki |
| 6,683,375 | B2 | 1/2004 | Joshi et al. |

(Continued)

FOREIGN PATENT DOCUMENTS

CN    1054237 C    7/2000

(Continued)

*Primary Examiner*—Fernando L Toledo
(74) *Attorney, Agent, or Firm*—Sughrue Mion, PLLC

(57) ABSTRACT

A columnar bump formed of copper etc. is formed on a wiring film of a semiconductor chip through an interconnected film and an adhesive film in a wafer unit by electrolytic plating in which package formation is possible. An oxidation prevention film is formed of such as gold on an upper surface or a part of the upper surface and side surface. A wet prevention film of such as an oxide film is formed on the columnar bump side as needed. If this bump is soldered to the pad on a packaging substrate, solder gets wet in the whole region of the columnar bump upper surface and only a part of the side surface. Stabilized and reliable junction form can be thus formed. Moreover, since the columnar bump does not fuse, the distance between a semiconductor board and a packaging board is not be narrowed by solder.

12 Claims, 28 Drawing Sheets

U.S. PATENT DOCUMENTS

| | | |
|---|---|---|
| 6,774,495 B2 | 8/2004 | Kim |
| 6,818,545 B2 | 11/2004 | Lee et al. |
| 6,888,209 B2 | 5/2005 | Jobetto |
| 7,135,770 B2 * | 11/2006 | Nishiyama et al. .......... 257/734 |
| 7,268,438 B2 * | 9/2007 | Nishiyama et al. .......... 257/780 |
| 2001/0004133 A1 | 6/2001 | Ihara |
| 2002/0017730 A1 | 2/2002 | Tahara et al. |
| 2002/0132461 A1 | 9/2002 | Kizaki |
| 2002/0149086 A1 | 10/2002 | Aoki |
| 2002/0192935 A1 | 12/2002 | Joshi et al. |
| 2003/0096495 A1 | 5/2003 | Ihara et al. |
| 2003/0134233 A1 | 7/2003 | Su et al. |
| 2004/0137724 A1 | 7/2004 | Joshi et al. |

FOREIGN PATENT DOCUMENTS

| | | |
|---|---|---|
| CN | 1326225 A | 12/2001 |
| JP | 53-080438 | 7/1978 |
| JP | 62-067826 A | 3/1987 |
| JP | 1-187948 A | 7/1989 |
| JP | 2-253626 A | 10/1990 |
| JP | 3-22437 A | 1/1991 |
| JP | 5-335313 A | 12/1993 |
| JP | 8-102467 A | 4/1996 |
| JP | 11-150090 A | 6/1999 |
| JP | 2000-208547 A | 7/2000 |
| JP | 2000-228417 A | 8/2000 |
| JP | 2000-299339 A | 10/2000 |
| JP | 2000-315706 A | 11/2000 |
| JP | 2000-323510 A | 11/2000 |
| JP | 2001-156097 A | 6/2001 |
| JP | 2001-284382 A | 10/2001 |
| JP | 2001-298342 A | 10/2001 |
| JP | 2001-319940 A | 11/2001 |

* cited by examiner

F I G. 4
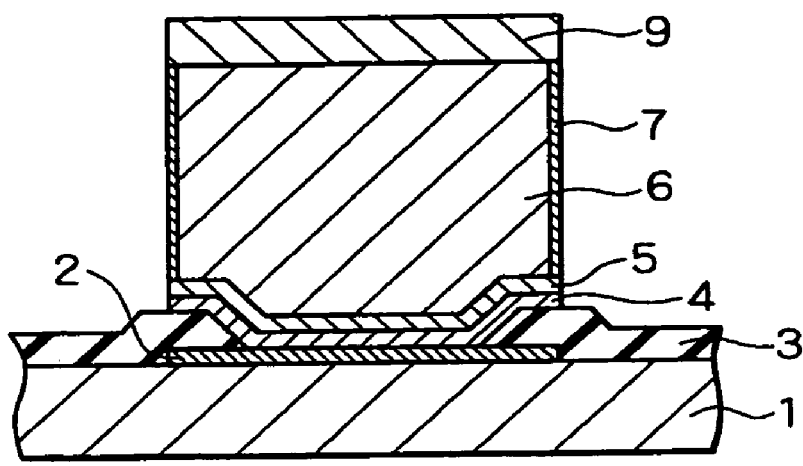
F I G. 5
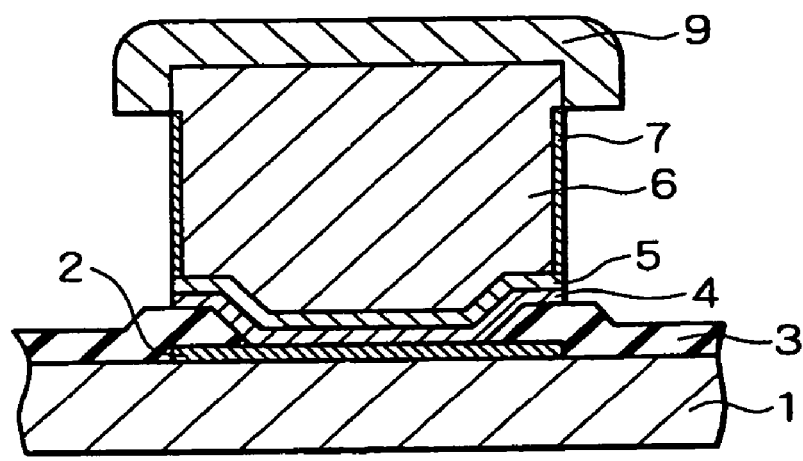
F I G. 6
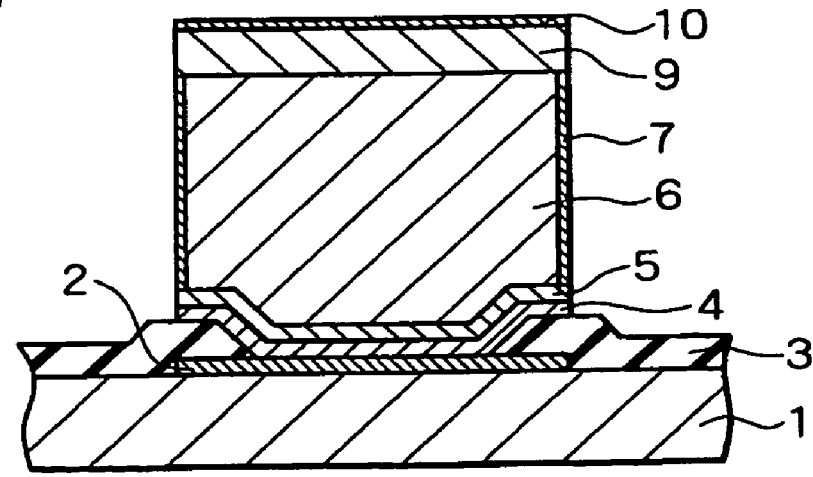

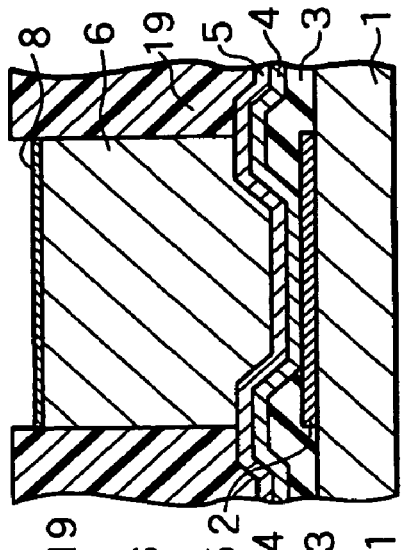
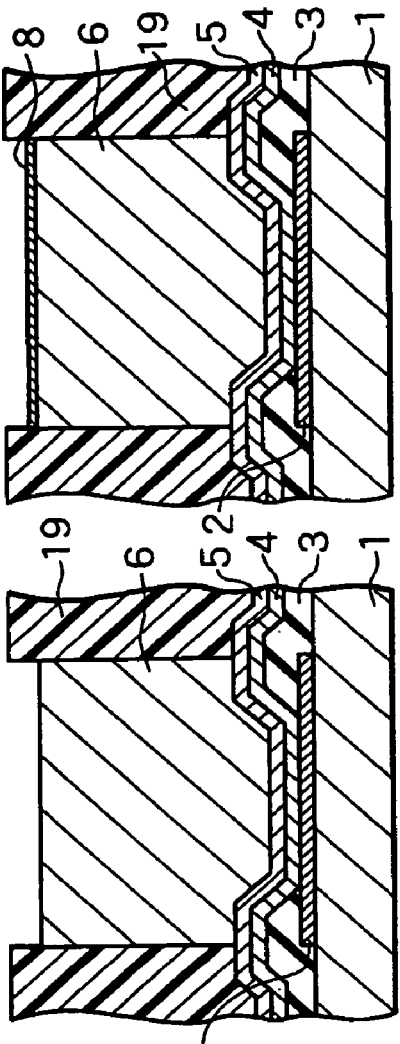
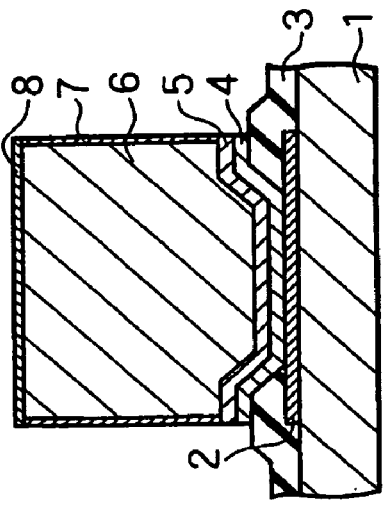
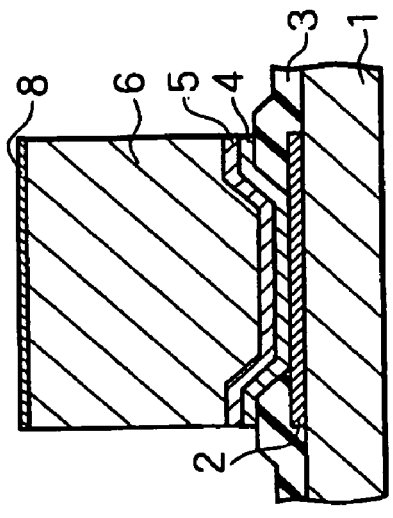
FIG. 9A  FIG. 9B  FIG. 9C  FIG. 9D  FIG. 9E

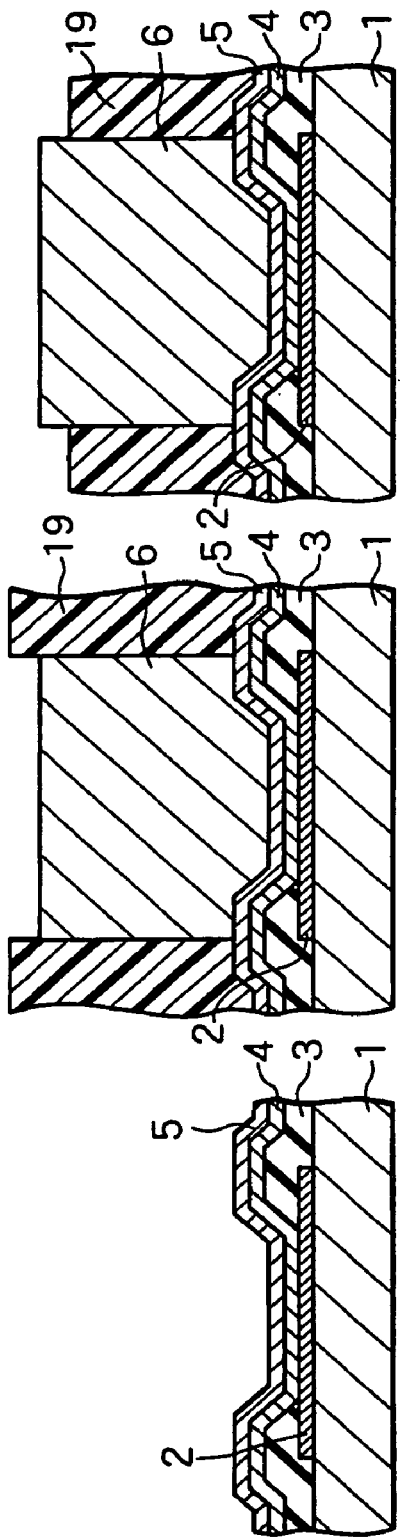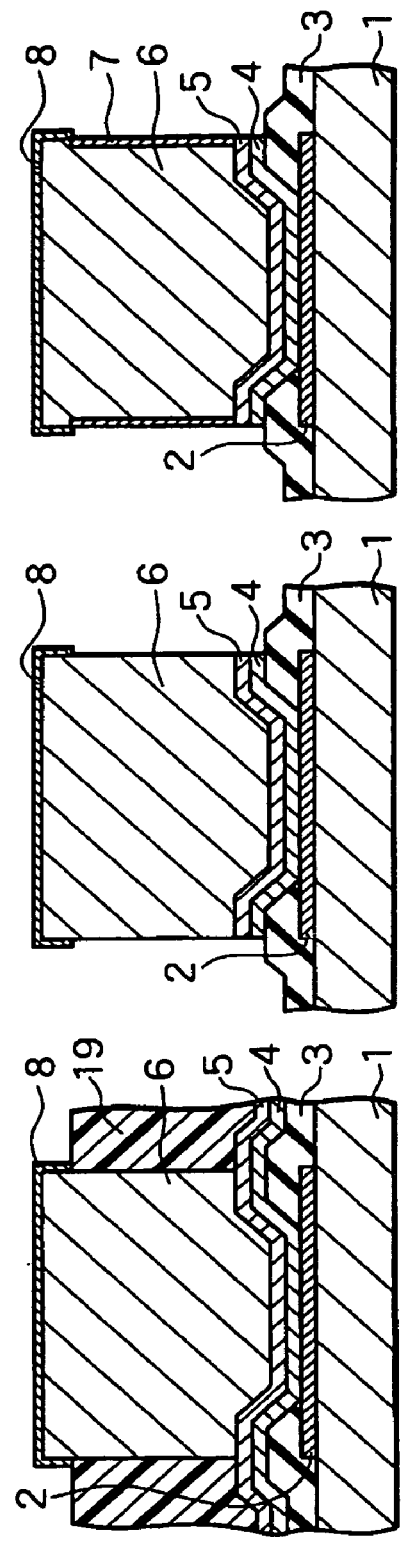

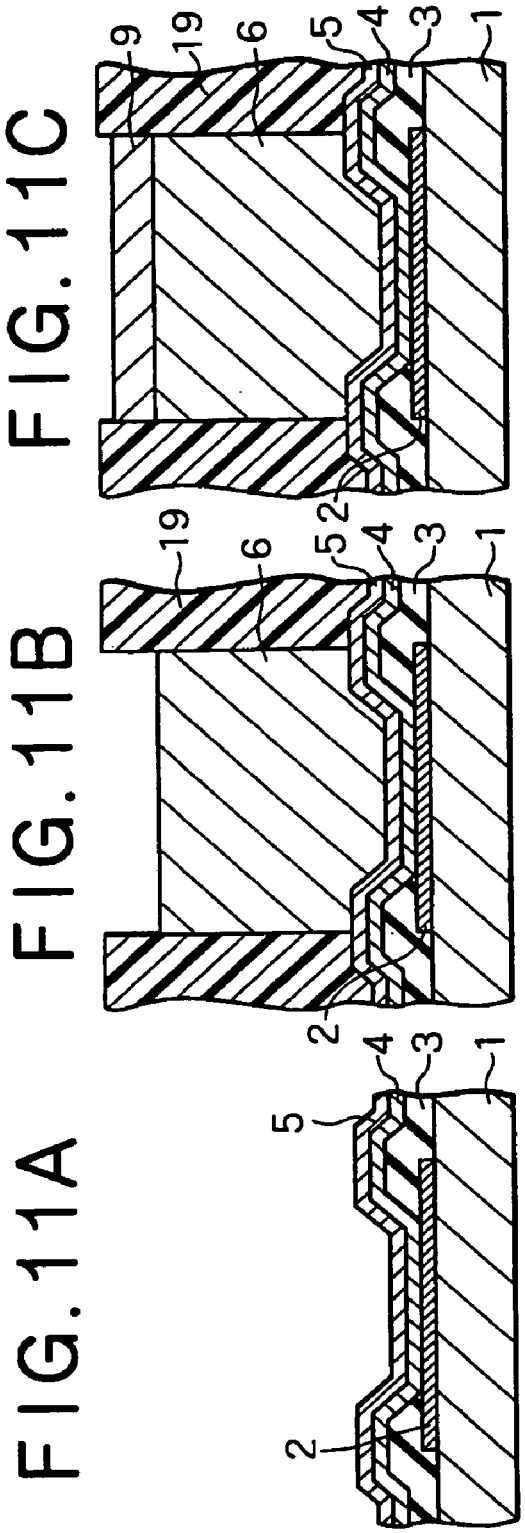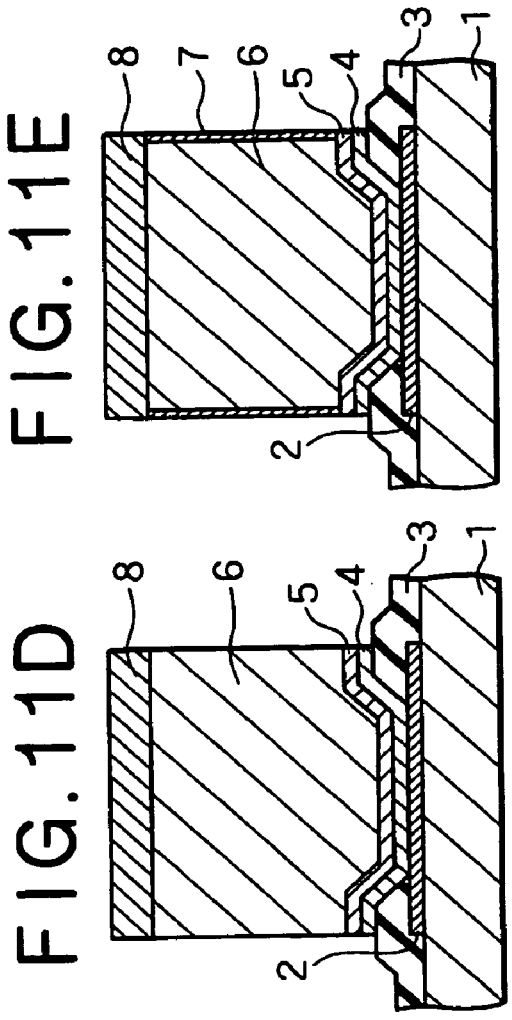

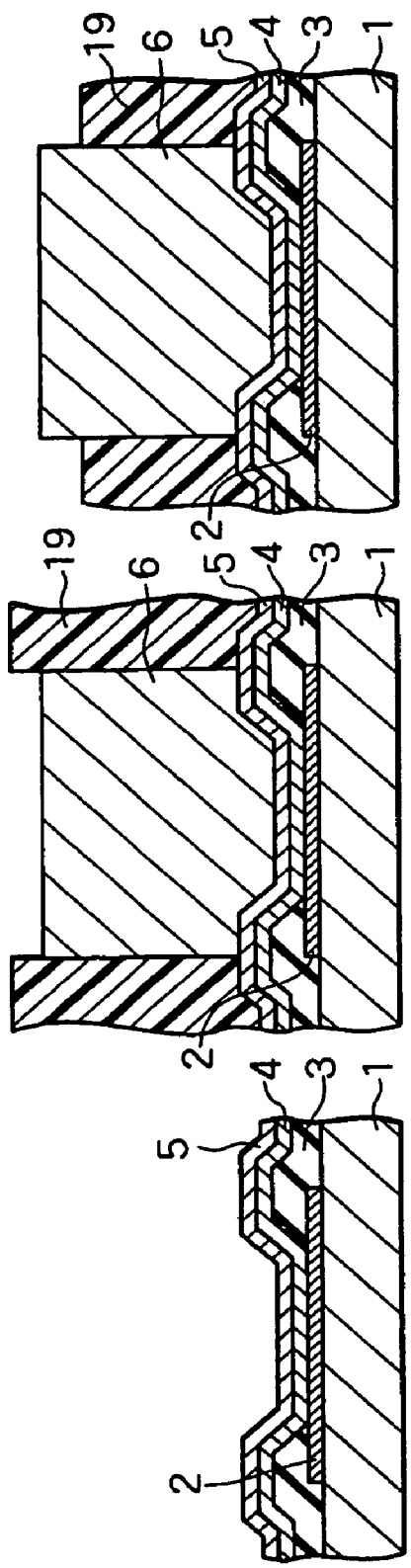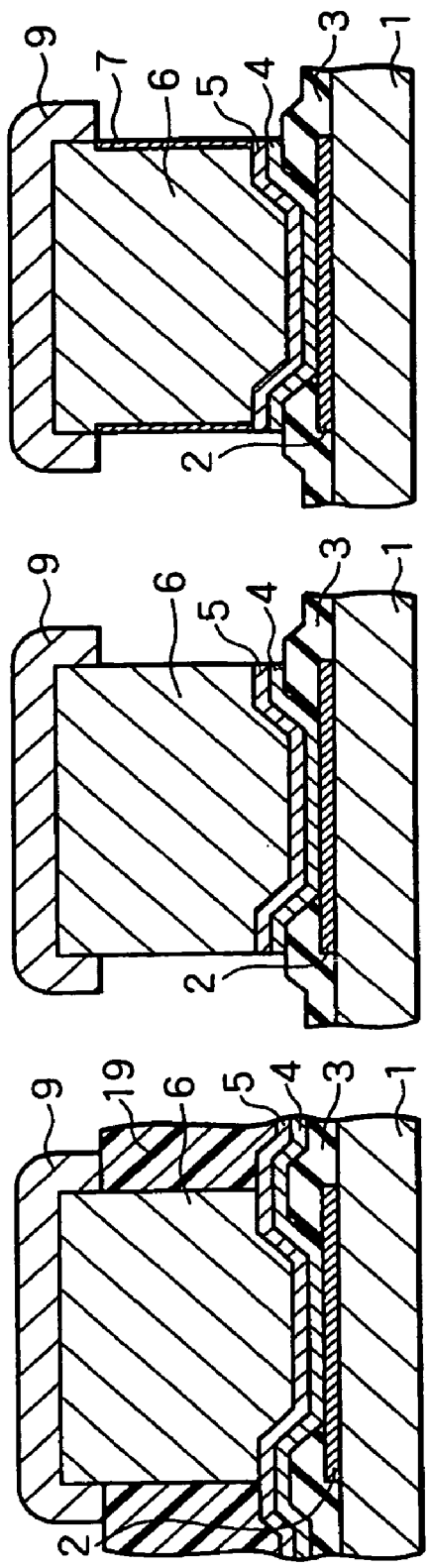

F I G. 28A
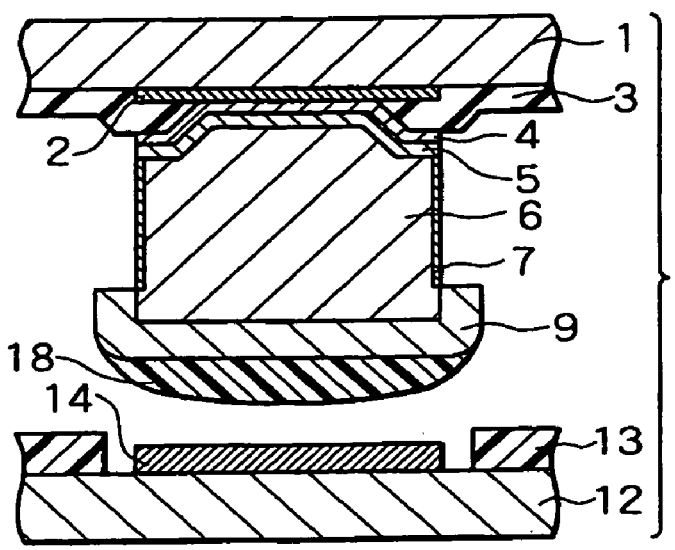
F I G. 28B
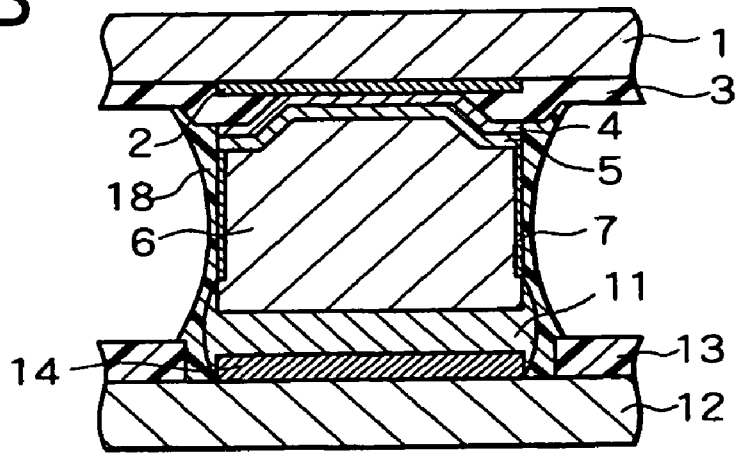
F I G. 28C
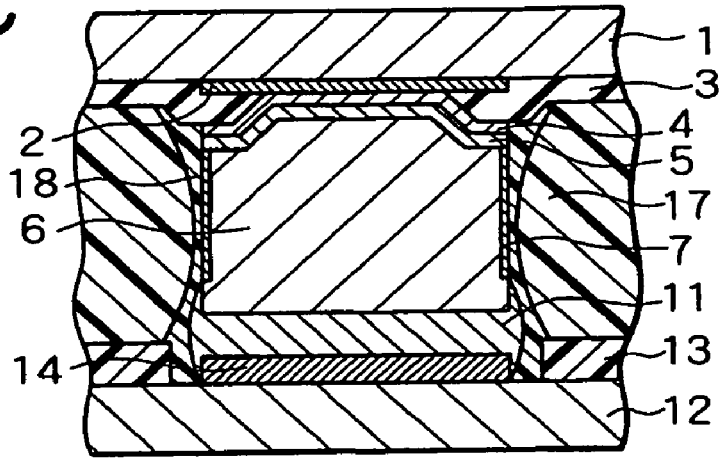

SEMICONDUCTOR ELEMENT AND A PRODUCING METHOD FOR THE SAME, AND A SEMICONDUCTOR DEVICE AND A PRODUCING METHOD FOR THE SAME

This is a divisional of U.S. application Ser. No. 11/271,819, filed Nov. 14, 2005, now U.S. Pat. No. 7,268,438 which is a divisional of U.S. application Ser. No. 10/359,124, now U.S. Pat. No. 7,135,770 filed Feb. 6, 2003, which claims priority from Japanese Patent Application No. 030334/2002, filed Feb. 7, 2002, the entire disclosure of which applications are incorporated herein by reference.

BACKGROUND OF THE INVENTION

1. Field of the Invention

The present invention relates to a semiconductor element and a producing method for the same, and a semiconductor device and a producing method for the same, more particularly relates to a bump structure of a flip chip type semiconductor element mounted face down and a producing method for the same, and a packaging structure thereof and a producing method for the same.

2. Description of the Related Art

As a connection method for connecting an electrode of a semiconductor element and an external terminal, there are two types of methods consisting of a bonding wire method using a metal thin wire and a flip chip method using a solder bump formed on an electrode of a semiconductor element. And the flip chip method is considered to be advantageous in a high-density and a high pin count tendency in recent years. In order to raise a packaging density of a semiconductor package in recent years, a ball grid array type semiconductor package with a solder bump formed as the external terminal is used abundantly as a technology which can respond to a high pin count tendency, keeping a terminal pitch large. A flip chip type is adopted also as a semiconductor element mounted to a packaging board (Interposer) in many cases. As this flip chip type connection method, many are developed. For example a connection method referred as a control coraps chip connection (C4) is mentioned first.

FIG. 35 is a cross-sectional view showing a conventional structure of a flip chip type semiconductor element. As shown in FIG. 35, on a semiconductor substrate 1, an electrode 2 which is connected to internal wiring and a cover film 3 having an opening on the electrode 2, is formed. And on the electrode 2, a solder bump 20 is formed through an interconnected film 4 and an adhesive film 5. As for a method for forming a solder bump 20, it is common to form a hemispherical bump by supplying solder by various methods such as an evaporation method, an electrolytic plating method, a solder paste printing method, and a solder ball loading and supplying method, and solder reflow process using flux.

FIG. 36 is a cross-sectional view showing a conventional flip chip packaging structure of flip chip type semiconductor element. On a pad 14 of a wiring substrate (Interposer) 12 wherein the pad 14 and a solder resist film 13 are formed on the surface, solder is supplied beforehand. Then, after applying flux, a semiconductor element is carried on the wiring substrate 12. And connection between bump 20 and pad 14 is completed by solder reflow process to form a solder fillet 11. Subsequently, the crevice between the wiring substrate 12 and a semiconductor substrate 1, which is not shown, is filled up with underfill resin.

A method for using bonding wire and forming a gold stud bump on the electrode of a semiconductor chip, in addition to a solder bump, and a method for forming a gold bump by electrolytic gold plating are conventionally known. These bumps are adhered to metal films such as gold plating, silver/tin solder, and indium/tin/lead solder formed in the wiring substrate side.

For securing reliability, filling up the crevice between a semiconductor chip and a wiring substrate with underfill resin after flip chip mounting is carried out. When resin filling is performed, keeping the crevice between a semiconductor chip and a wiring substrate large is preferable for performing good filling without generating void. However, if a solder bump is required to be formed highly in height so as to be melted on an electrode and shaped in hemisphere form, the amount of solder to be supplied should be increased. This makes it possible to short circuit to an adjoining solder bump, between the electrodes having a fine pitch. Therefore, it is becoming difficult to form a solder bump with height on an electrode with advance of a fine pitch tendency. On the other hand, since, as for the fine pitch tendency, filling resin stream is narrowed superficially, the difficulty of filling of underfill resin is accelerated by fine pitch.

A method for forming a solder bump by an evaporation method and a solder paste printing method involves an increased manufacturing cost, since a durability of a mask is scarce as well as requiring the mask.

Also, a solder ball supplying method involves a comparatively high cost of the solder ball per se, and needs equipment wherein a solder ball is aligned in a required layout and carried on a semiconductor chip. Since package loading in a wafer unit is difficult, the bump formation cost as total becomes high. Moreover, manufacture of solder ball with further small diameter corresponding to a fine pitch is difficult. Then, the smaller the required ball size (diameter) becomes, the more the manufacturing yield falls, incurring an influence on high cost.

Furthermore, when there is an electrode arranged on a memory cell, and when solder is used as a bump material, alpha rays generated from a radioactive element contained in a lead which constitutes solder or tin may cause a soft error.

Also, there are the plating bump and stud bump using gold. However, problem such that cost of gold materials is high is posed. There is also raised a problem such that the more the number of bumps increases, the more formation cost increases also, in order to carry out individual formation in a gold stud bump.

Furthermore, when solder junction of the bump which used gold plating is carried out, since gold has a good wettability, solder is getting wet upwardly on side surface and enters from the interface of an electrode and gold plating. This may result in the fall of interface intensity, or exfoliation in the end, involving the problem on reliability.

Also, a soldering technique by use of a plating bump using copper is also proposed. For example, after forming a copper bump by an electrolytic plating method, forming the polyimide film on a semiconductor board so that the upper half of the copper bump may be exposed, and forming a solder film on the copper bump by dipping method is disclosed in JP-A-3-22437. However, with a flip chip coated with a thick resin film in this way, when mounted on a wiring substrate, it becomes difficult to be filled up with underfill resin. In addition, since an adhesion nature of the copper bump and the polyimide film is low, unless processing special to the copper bump side is performed, solder easily gets wet, spreading to the electrode. Problem on reliability is thus raised similarly to the case of a gold bump.

SUMMARY OF THE INVENTION

An object of the present invention is to secure full distance between chip and substrate even if an electrode has a fine pitch.

The other object of the present invention is to provide a bump structure of a flip chip which can be created at low cost.

The other object of the present invention is to provide a packaging structure of a low possibility of causing the reliability fall such as a soft error or pad exfoliation.

A semiconductor element according to the present invention comprises a columnar projection which serves as a bump and is formed on an electrode through an interconnected film or an adhesive film. An upper surface of said columnar projection is coated with, or an upper surface and upper portion of a side surface of the aforementioned columnar projection are coated with a cap film which is excellent in wettability is provided.

Also, a semiconductor element according to another aspect of the present invention comprises a columnar projection which serves as a bump and is formed on an electrode through an interconnected film or an adhesive film. A wet prevention film is formed at a part at least close to the electrode of the side surface of the columnar projection.

Also, a method of producing a semiconductor element according to the present invention, comprising the steps of:

forming a metal film serving as a plating electrode on the whole part of a semiconductor substrate having an electrode formed thereon;

forming a resist film having an opening in the position of said electrode on said metal film;

depositing a high conductivity metal in columnar form to form a columnar projection by electrolytic plating;

removing said resist film;

etching to remove said metal film by using said columnar projection as a mask; and forming a wet prevention film on the surface of said columnar projection.

Also, a method of producing a semiconductor element according to another aspect of the present invention comprises the steps of:

forming a resist film on a semiconductor substrate, said resist film having an opening in the position of an electrode formed on said semiconductor substrate;

conducting an activation processing to electroless plating to form an activation film on said resist film;

removing said activation film on said resist film;

depositing a high conductivity metal in said opening by electroless plating to form a columnar projection;

removing said resist film; and forming a wet prevention film on the surface of said columnar projection.

A semiconductor device according to the present invention comprises: a conductive columnar projection formed on the electrode of a semiconductor element and is soldered to a pad on a wiring substrate. At least a part of the side surface of said columnar projection is coated with a wet prevention film.

Also, a semiconductor device according to another aspect of the present invention comprises: a conductive columnar projection formed on an electrode of the semiconductor element and is soldered to a pad of a wiring substrate. The soldering part of said conductive columnar projection is limited to the upper surface of said columnar projection.

Also, a semiconductor device according to another aspect of the present invention comprises: a conductive columnar projection formed on an electrode of the semiconductor element and is soldered to a pad of a wiring substrate. Said columnar projection is soldered through a metal film excellent in soldering wettability as well as having a difficulty in oxidation which is formed on the upper surface of said columnar projection or the upper portion or upper surface of said columnar projection side surface.

Also, a semiconductor device according to another aspect of the present invention comprises: a conductive columnar projection formed on an electrode of the semiconductor element and is connected to a pad on a wiring substrate. An upper surface of said columnar projection and a surface of a pad of said wiring substrate are joined through a metal film which is excellent in soldering wettability as well as having difficulty in oxidation.

Also, a method of producing a semiconductor device according to the present invention comprising the steps of:

providing a thermosetting resin having a flux activity effect to the tip end of a columnar projection formed on the electrode of a semiconductor element;

aligning said columnar projection and a pad of the wiring substrate which was supplied with a predetermined quantity of solder; and heating and soldering only the tip part of said columnar projection to the pad of said wiring substrate.

A method of producing a semiconductor device according to another aspect of the present invention comprises the steps of:

supplying a flux on the tip end of the columnar projection formed on an electrode of a semiconductor element;

aligning said columnar projection and a pad of a wiring substrate supplied with a predetermined quantity of solder;

heating and soldering only the tip part of said columnar projection to a pad of said wiring substrate; and cleaning and removing said flux.

Also, a method of producing a semiconductor device according to another aspect of the present invention comprises the steps of:

supplying a thermosetting resin having the flux activity effect on a pad of a wiring substrate;

aligning a columnar projection formed on an electrode of a semiconductor element and having a solder film on the tip part, and a pad of said wiring substrate; and heating and soldering only the tip part of said columnar projection to a pad of said wiring substrate.

Also, a method of producing a semiconductor device according to another aspect of the present invention comprises the steps of:

supplying a flux on a pad of a wiring substrate;

aligning a columnar projection formed on an electrode of a semiconductor element and having a solder film on a tip end part, and a pad of said wiring substrate;

heating and soldering only the tip part of said columnar projection to a pad of said wiring substrate; and cleaning and removing said flux.

Also, a method of producing a semiconductor device according to another aspect of the present invention comprises the steps of:

cleaning a tip surface of a columnar projection formed on an electrode of a semiconductor element and a pad surface of a wiring substrate by a physical shock of an inactive gas excited by plasma;

aligning said columnar projection and a pad of said wiring substrate; and pressurizing between said semiconductor element and said wiring substrate to adhere said columnar projection and said pad.

In the present invention, connection system between a semiconductor element and a wiring substrate is different from a conventional connection system wherein solder is connected with each other or gold stud bump and a solder of the wiring substrate side are connected. However, in this invention, a columnar bump of a semiconductor element side and a pad of the wiring substrate are connected through a little quantity of solder, or directly connected without through solder. In addition, in this invention, even when connection is made by solder, contact of a columnar bump and solder is limited to an upper surface of the columnar bump or only a little bit part of the upper surface and the side surface thereof. A columnar bump is formed by an electrolytic plating method etc. using a metal which is not fused at soldering temperature, and since it is not rounded by reflow, a comparatively high bump can be formed in relation to a bottom size. Moreover, when a semiconductor chip is carried on a wiring substrate, a columnar bump does not fuse but maintain the form in early stages of formation. This allows the distance between a wiring substrate and a semiconductor chip to be fully secured. This further allows underfill resin filling to be easily and highly reliably performed after flip chip connection. Namely, as for a connection of solders wherein when having a fine pitch, along with a smaller diameter size of a bump, crevice reduction of a semiconductor chip and a wiring substrate is generated, and workability and reliability are predominantly gained.

A batch processing of a wafer unit is possible. And this will be mentioned, for example, as other features of forming a columnar bump using an electrolytic plating method or the electroless plating method. Whereby, it becomes possible to manufacture at low cost compared with a conventional ball loading supplying method. Also, in case of using a thermosetting resin which has a flux activity effect instead of the flux used for the purpose of the oxide film removal on the surface of a bump at the time of packaging onto the wiring substrate of a semiconductor chip, cleaning process can be deleted. This contributes to cleaning process reduction to allow cost cut or no cleaning residue. Consequently, an improvement effect in reliability is gained.

Moreover, since reduction or deletion of the amount of the solder used is possible, the reduction or zeroing of alpha dose which is one of the causes of malfunction is possible. This contributes to an improvement in reliability.

Also, according to this invention, solder does not get wet upwardly as far as a columnar base of a bump at the time of packaging. The interface exfoliation by the solder-coming-in onto the interface of an interconnected film/adhesive film, or an adhesive film/bump can be prevented, and improvement in reliability can be aimed at.

Moreover, when making a junction form in which solder gets wet upwardly as far as a part of the side surface of a columnar bump, a process is increased when forming a bump. However, when the contact surface area of a columnar bump and solder is widened, stress is distributed and junction part reliability can be raised.

In a semiconductor device producing method for this invention, a cap film or a solder plating film is formed on an upper surface of the columnar bump, or in a part of an upper surface or side surface thereof. Therefore, a junction form wherein solder possibly covers the whole upper surface of the columnar bump, or solder possibly covers the hole upper end portion is stably made up. Whereby, the strength fall in junction between the columnar bump and adhesive films or formation of a stress concentration part can be prevented, and a reliable junction part can be obtained.

BRIEF DESCRIPTION OF THE DRAWINGS

FIG. 4 is a cross-sectional view of a fourth embodiment of a semiconductor element of this invention.

FIG. 5 is a cross-sectional view of a fifth embodiment of a semiconductor element of this invention.

FIG. 6 is a cross-sectional view of a sixth embodiment of a semiconductor element of this invention.

FIG. 9 is a cross-sectional view of a second embodiment of a producing method for a semiconductor element of this invention.

FIG. 10 is a cross-sectional view of a third embodiment of a producing method for a semiconductor element of this invention.

FIG. 11 is a cross-sectional view of a fourth embodiment of a producing method for a semiconductor element of this invention.

FIG. 12 is a cross-sectional view of a fifth embodiment of a producing method for a semiconductor element of this invention.

FIG. 28 is a cross sectional view of a tenth embodiment of a producing method for a semiconductor device of this invention.

DETAILED DESCRIPTION OF THE PREFERRED EMBODIMENTS

Figure 1:
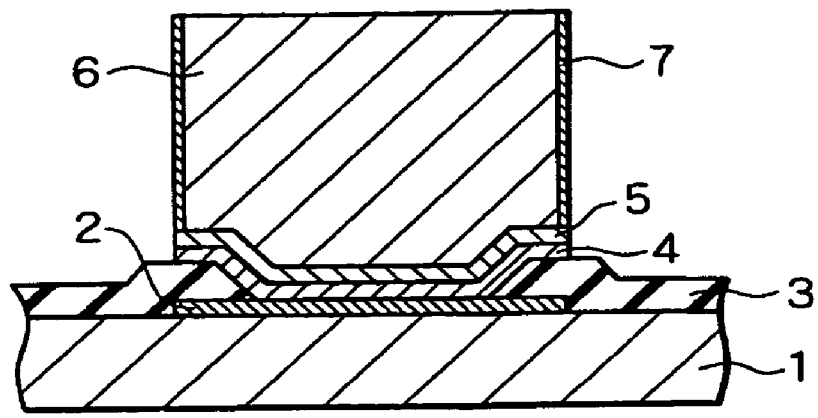
FIG. 1 is a cross-sectional view of a first embodiment of a semiconductor element of this invention.

Preferred embodiments of the present invention will be described below with reference to the accompanying drawings. FIG. 1 is a cross-sectional view showing a first embodiment of a semiconductor element according to the present invention. As shown in FIG. 1, on a semiconductor substrate 1, an electrode 2 connected to an internal circuit is formed. And on the semiconductor substrate 1 is covered with a cover film 3 which has an opening on the electrode 2. On the electrode 2, a columnar bump 6 composed of such as copper through an adhesive film 5 composed of an adhesive film 4 which composed of such as titanium (Ti) and copper (Cu), is formed. A wet prevention film 7 wherein adhesion of solder and wetting upwardly are prevented is formed on the side surface of the columnar bump 6. The columnar bump 6 may be formed using copper alloy, or nickel and nickel alloy other than copper.

Figure 2:
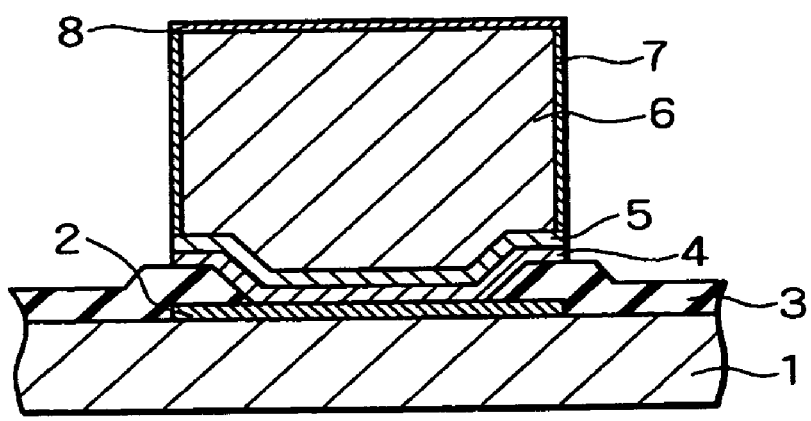
FIG. 2 is a cross-sectional view of a second embodiment of a semiconductor element of this invention.

FIG. 2 is a cross-sectional view showing a second embodiment of a semiconductor element of this invention. In FIG. 2, the portions of the same designation as those in FIG. 1 used for the explanation so far are designated the same reference numbers, omitting and simplifying the overlapping explanation (similarly omitted in other embodiments). Difference from the first embodiment shown in FIG. 1 of this embodiment resides in the formation such that a cap film 8 which prevents the columnar bump 6 from oxidation and composed of gold (Au) which demarcates the domain of getting wet at the time of the soldering is formed.

Figure 3:
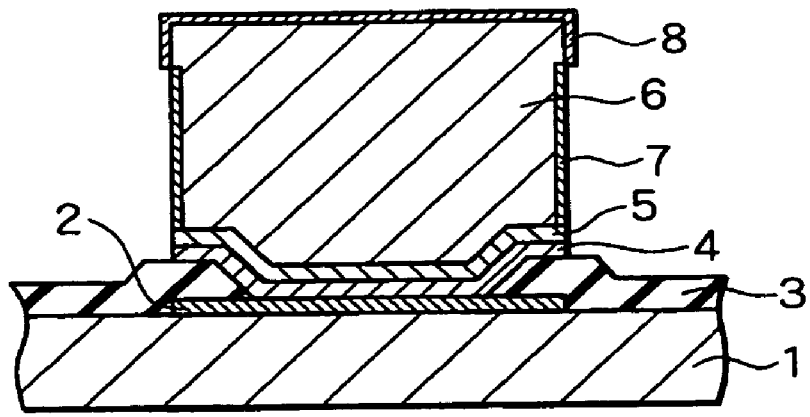
FIG. 3 is a cross-sectional view of a third embodiment of a semiconductor element of this invention.

FIG. 3 is a cross-sectional view showing the third exemplary embodiment of a semiconductor element of this invention. Difference from the first embodiment shown in FIG. 1 of this invention resides in the formation such that a cap film 8 composed of a gold (Au) which prevents a columnar bump 6 from oxidation and demarcates a domain of getting wet at the time of soldering is formed on an upper surface or on a part of the side surface of the columnar bump 6, and a wet prevention film 7 is deleted from the side surface portion of the columnar bump 6 having the cap film 8 formed thereon.

As for a second and third embodiment, when a cap film 8 is formed with material with fully high wettability to a columnar bump, a wet prevention film can be omitted. Moreover, a cap film may be formed using a resin material using a resin material known as a pre-flux coat material which fuses by flux at the time of soldering, replacing a metallic cap film.

FIG. 4 is a cross-sectional view showing a fourth embodiment of a semiconductor element of this invention. Difference from a first embodiment shown in FIG. 1 of this embodiment resides in a formation in which a planting layer 9 is formed on an upper surface of a columnar bump 6.

FIG. 5 is a cross-sectional view showing a fifth embodiment of a semiconductor element of this invention. Difference from a first embodiment shown in FIG. 1 of this embodiment resides in a formation in which a plating film 9 is formed on a upper surface or a part of the side surface of a columnar bump 6, and a wet prevention film 7 is deleted from the side portion of the columnar bump 6 having solder plating film 9 formed thereon.

FIG. 6 is a cross-sectional view showing a sixth embodiment of a semiconductor element of this invention. Difference from a fourth embodiment shown in FIG. 4 of this embodiment resides in a formation in which a thin golden layer 10 is formed on an upper surface of a solder plating layer 9.

Figure 7:
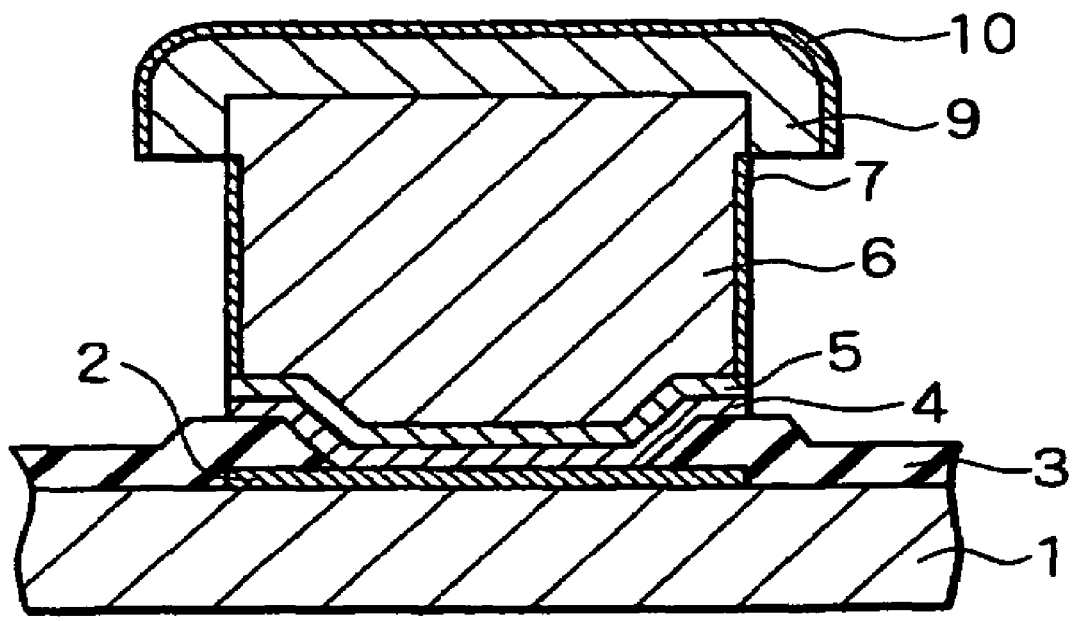
FIG. 7 is a cross-sectional view of a seventh embodiment of a semiconductor element of this invention.

FIG. 7 is a cross-sectional view showing a seventh embodiment of a semiconductor element of this invention. Difference from a fifth embodiment shown in FIG. 5 of this embodiment resides in a formation in which a thin gold film 10 is formed on an upper surface or side surface of a solder plating film 9.

FIGS. 8A to 8E are cross-sectional views showing order of a producing method for a semiconductor element of this invention. As shwn in FIG. 8A, an electrode 2 and a front surface of a cover film 3 of a semiconductor substrate 1 are coated with an interconnected film 4 and an adhesive film 5, by sputtering method etc. The interconnected film 4 is preferably formed with titanium. However, a single layer containing titanium alloys such as nitriding titanium, titanium/tungsten alloy, in addition to titanium or multiple layers, and a single layer containing chromium, chromium/copper alloy, or multiple layers may be substituted. The adhesive film 5 is preferably formed with copper. However, if adhesion power with a columnar bump (copper plating film etc) which is formed other than copper, is strong and electrical resistance is in the range of a small metal, composition substance is not limited.

Figure 8A:
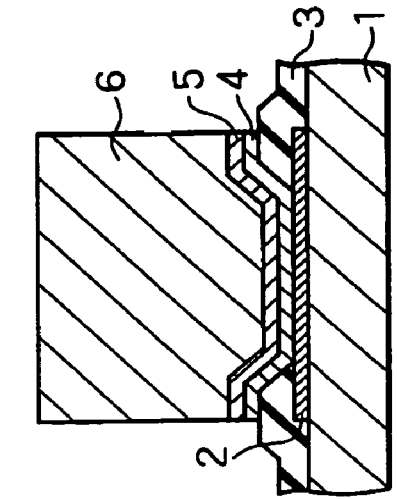
FIG. 8 is a cross-sectional view of a first embodiment of a producing method for a semiconductor element of this invention.
Figure 8B:
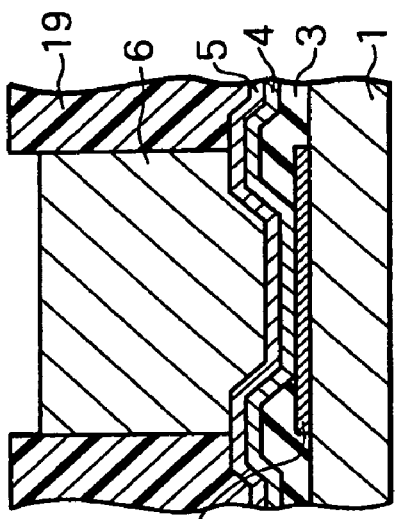

Next, as shown in FIG. 8B, a plating resist film 19 having a thickness more than a height of the bump which should be formed and has an opening on an electrode 2, is formed using photoresist etc. Electrolytic plating is performed by making this into a mask, and a columnar bump 6 is formed.

Figure 8C:
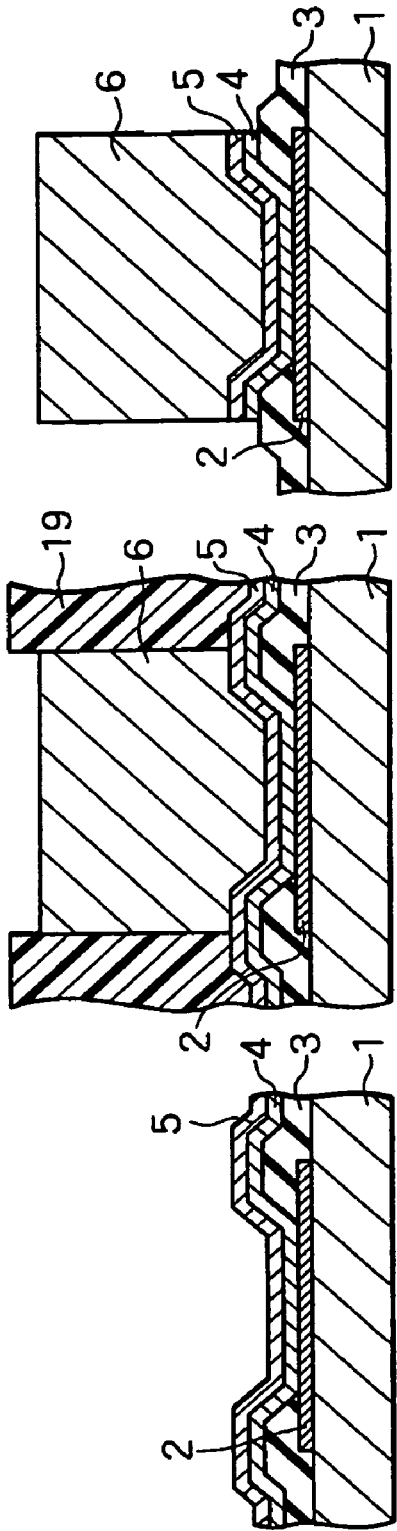

Next, as shown in FIG. 8C, the plating resist film 19 is removed by ashing etc, and etching removal of the adhesive film 5 and the interconnected film 4 in an exposure form is carried out, using the columnar bump 6 as a mask.

Figure 8D:
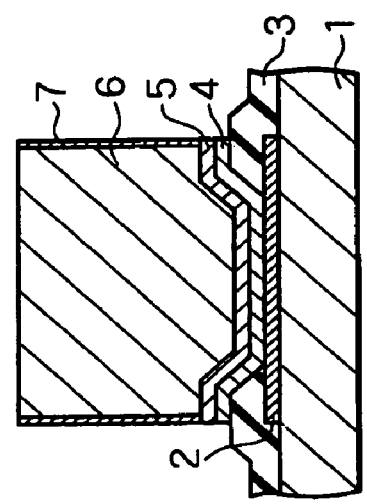

Subsequently, as shown in FIG. 8D, heat-treatment is performed in oxidizing atmosphere, so as to obtain a wet prevention film 7 on a surface of the columnar bump 6.

Figure 8E:
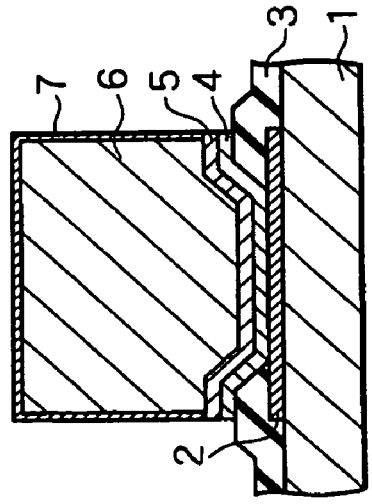

Next, as shown in FIG. 8E, after exposed to the plasma of inactive gas such as argon (Ar), removal of the only wet prevention film of an upper surface of the columnar bump 6 is carried out.

Replacing a method wherein unnecessary wet prevention film is exposed to the plasma of inactive gas to be removed, after covering the part by a mask where a wet prevention film is not necessary to be formed, oxidation processing is performed, and the mask may be removed thereafter. Wet prevention film 7 may be formed with a silicon oxide film or a silicon nitride film, etc. deposited, by a film formation technology such as plasma CVD method. In this case also, after a wet prevention film is formed in front, unnecessary wet prevention film is exposed to the plasma of inactive gas to be removed. Or after a portion where a wet prevention film does not needed to be formed is covered with a mask, films are formed, and the mask may be removed thereafter. In case that a wet prevention film 7 is formed by a film formation technology such as CVD method, a wet prevention film 7 with film thickness almost equivalent to a side surface of the columnar bump 6 is obtained on the side surface of an interconnected film 4 and a adhesion film 5.

FIGS. 9A to 9E are cross-sectional views of a process order showing a second embodiment of a producing method for a semiconductor element of this invention. In this embodiment, up to the process shown in FIG. 9B is the same as the first embodiment.

Then, as shown in FIG. 9C, a cap film 8 is formed on an upper surface of a columnar bump 6 by an electrolytic plating method or electroless plating method. As shown in FIG. 9D, a plating resist film 19 and an adhesive film 4 and an interconnected film 5 thereunder are removed. Then, a wet prevention film 7 is formed on the side surface of the columnar bump 6 by heat-treatment in the atmosphere of oxidizing.

FIGS. 10A to 10F are cross-sectional views of a process order showing a third embodiment of a producing method for a semiconductor element of this invention. In this embodiment, up to a process shown in FIG. 10B is the same as the first embodiment. Then, half etching is performed to the plating resist film 19, and a part of a columnar bump 6 side is exposed as shown in FIG. 10C.

Subsequently, a cap film 8 is formed on an upper surface or upper side of a columnar bump 6 by an electrolytic plating method or an electroless plating method, as shown in FIG. 10D. After removing the plating resist film 19, an interconnected film 4 thereunder, and an adhesive film 5, by being subjected to heat-treatment in the atmosphere of oxidizing, a wet prevention film 7 is formed on the columnar bump 6 side surface, as shown in FIG. 10F.

Referring to a second and third embodiment, a wet prevention film 7 can be formed by use of a film formation technology such as a plasma CVD method. At that time, after covering a no film formation domain using a mask, films can be formed. The same is said of other embodiments.

In a second and third embodiment, gold is advantageously used for the material of the cap film 8. However, any material which is excel in solder wettability, and can prevent an oxidation of a columnar bump, can be used. For example, such as gold alloy, tin, indium or palladium can be mentioned as available.

FIGS. 11A to 11E are cross-sectional views of a process order showing a fourth embodiment of a producing method for a semiconductor element of this invention. In this embodiment, up to a process shown in FIG. 11B is the same as first embodiment. A solder plating film 9 is formed on an upper surface of a columnar bump 6 by an electrolytic plating method subsequently to a columnar formation of a bump. [FIG. 11C]. Next, a plating resist film 19, an interconnected film 4 thereunder, and an adhesive film 5 are removed [FIG. 11D]. Then, after subjected to heat-treatment in oxidizing atmosphere to form a wet prevention film 7 on a surface of a columnar bump 6, sputter removal of oxide film is carried out on a solder plating film 9 [FIG. 11E].

FIG. 12A to F is a cross-sectional view of a process order showing a fifth embodiment of a producing method for a semiconductor element of this invention. This embodiment is the same as a fourth embodiment shown in FIG. 11 except for half etching process (FIG. 12C) before forming a solder plating film 9.

In a fourth and fifth embodiment, a solder plating film 9 can be formed using tin/eutectic lead alloy, but not limited thereto but a material used as a solder material is employable as needed. Also, a solder which does not contain a lead is preferably adopted. Moreover, in the fourth and fifth embodiment, after formation of the solder plating film 9, electrolytic or electroless plating is performed successively. A metal film may be formed thinly on the solder plating film 9 as shown in FIG. 6 and FIG. 7.

A bump may be formed by an electoless plating method. In this case, patterning of an interconnected film and an adhesive film is performed in a state shown in FIG. 9A so as to form a resist film having an opening on a bump formation part. Then, an activation processing by such as zinc is performed, an unnecessary activity layer is removed as needed, and an electroless plating of such as nickel is performed to form a bump, before resist film is removed. The bump may be formed directly on an electrode without forming an interconnected film and an adhesive film.

Figure 13:
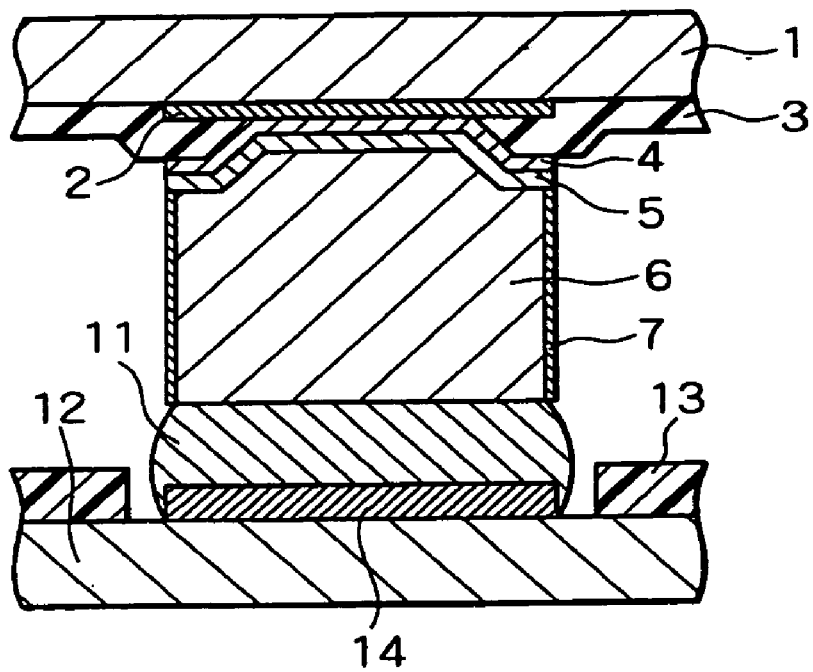
FIG. 13 is a cross sectional view of a first embodiment of a semiconductor device.

FIG. 13 is a cross-sectional view showing a first embodiment of a semiconductor device of this invention. The semiconductor element according to this invention is carried on a wiring substrate 12 wherein a pad 14 and a solder resist film 13 are formed on the surface. In this embodiment, a columnar bump 6 of the semiconductor element is joined to a pad 14 on the wiring substrate 12 by solder fillet 11 only on the upper surface (in this specification, the opposite side to an electrode 2 of a columnar bump is referred as an upper surface).

Figure 14:
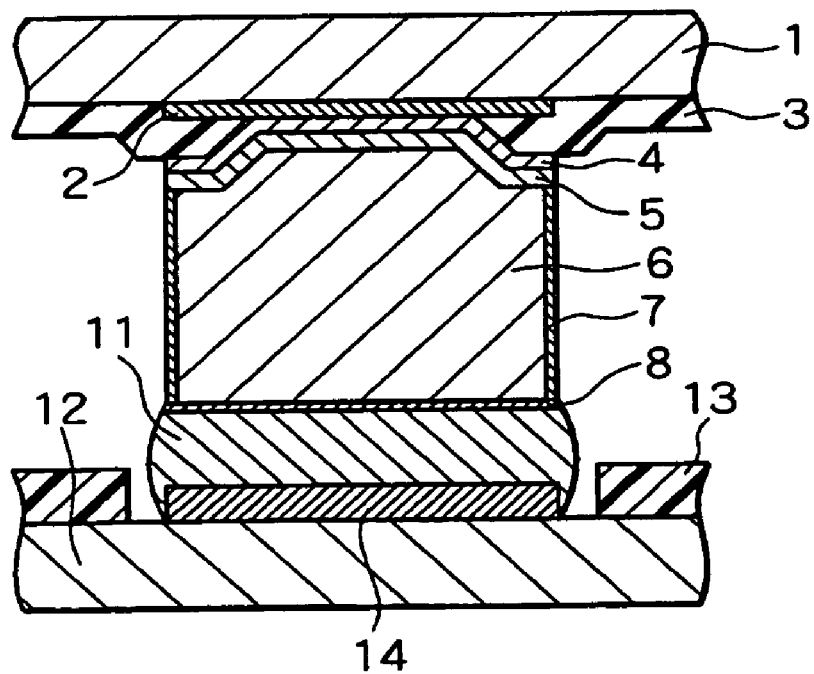
FIG. 14 is a cross sectional view of a second embodiment of a semiconductor device.

FIG. 14 is a cross-sectional view of a second embodiment of a semiconductor device of this invention. Difference from a first embodiment shown in FIG. 13 of this embodiment resides in a formation such that a cap film 8 is formed on an upper surface of a columnar bump 6.

Figure 15:
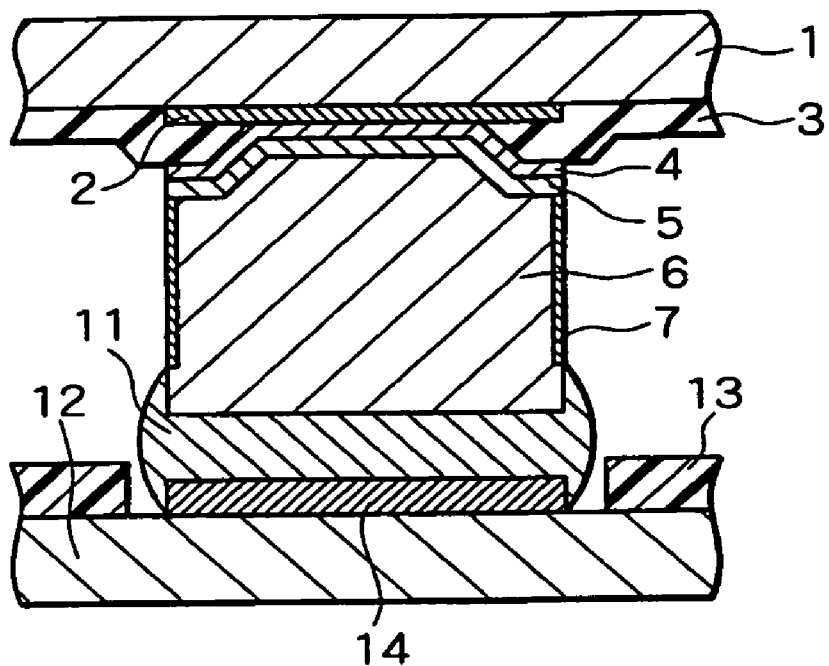
FIG. 15 is a cross sectional view of a third embodiment of a semiconductor device.

FIG. 15 is a cross-sectional view of a third embodiment of a semiconductor device of this invention. Difference from a first embodiment shown in FIG. 13 of this embodiment resides in a formation such that a columnar bump 6 of a semiconductor element is joined to a solder fillet 11 also, not only in the upper surface but in a part of its side surface.

Figure 16:
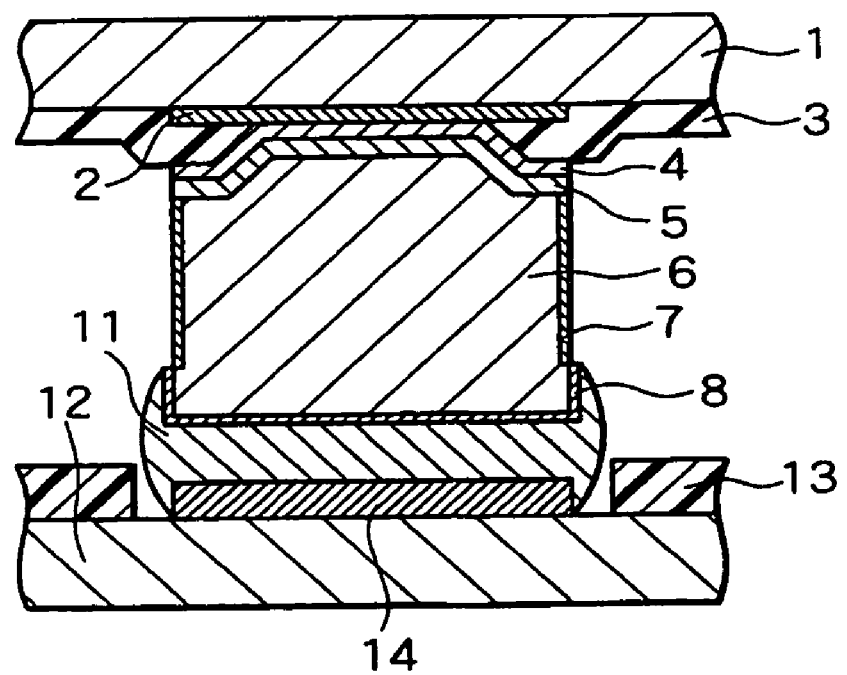
FIG. 16 is a cross sectional view of a fourth embodiment of a semiconductor device.

FIG. 16 is a cross-sectional view showing a fourth embodiment of a semiconductor device of this invention. Difference from a third embodiment shown in FIG. 15 of this embodiment resides in a formation such that a cap film 8 is formed on an upper surface of columnar bump 6 of a semiconductor element or a part of its side surface.

Figure 17:
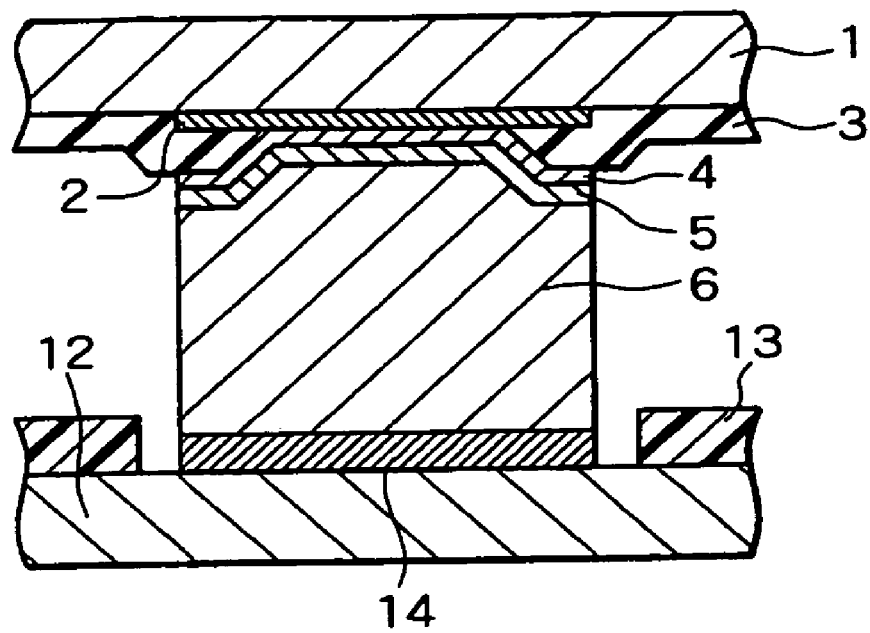
FIG. 17 is a cross sectional view of a fifth embodiment of a semiconductor device.

FIG. 17 is a cross-sectional view showing a fifth embodiment of a semiconductor device of this invention. In this embodiment, a columnar bump 6 of a semiconductor element is directly joined to a pad 14 on a wiring substrate 12 through no aid of solder.

Figure 18:
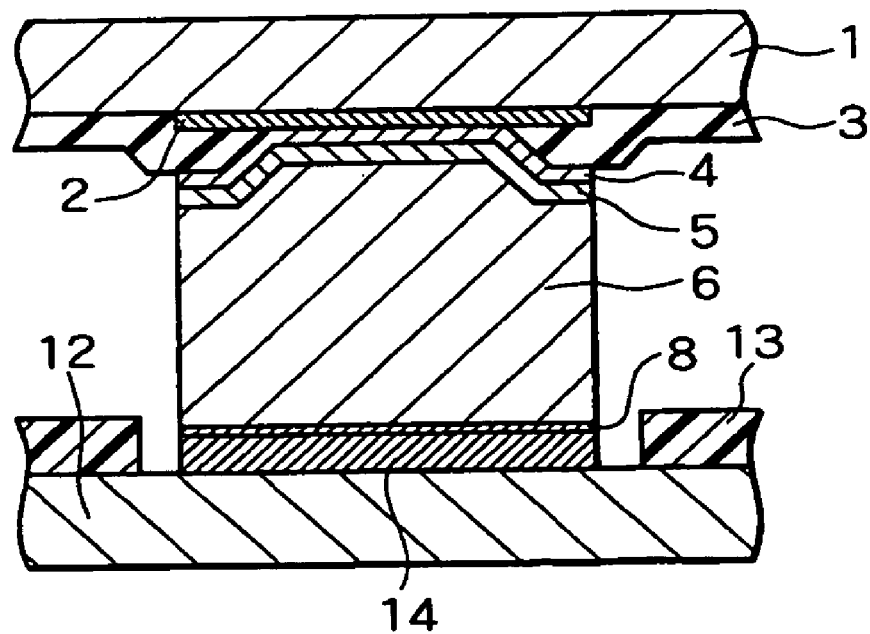
FIG. 18 is a cross sectional view of a sixth embodiment of a semiconductor device.

FIG. 18 is a cross-sectional view showing a sixth embodiment of a semiconductor device of this invention. In this embodiment, a columnar bump 6 of a semiconductor element is joined to a pad 14 on a wiring substrate 12 through a cap film 8.

Figure 19A:
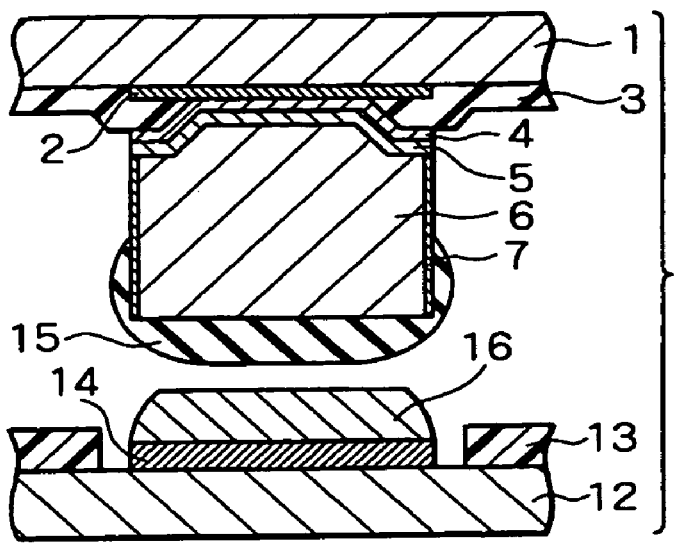
FIG. 19 is a cross-sectional view of a first embodiment of a producing method for a semiconductor device of this invention.
Figure 19B:
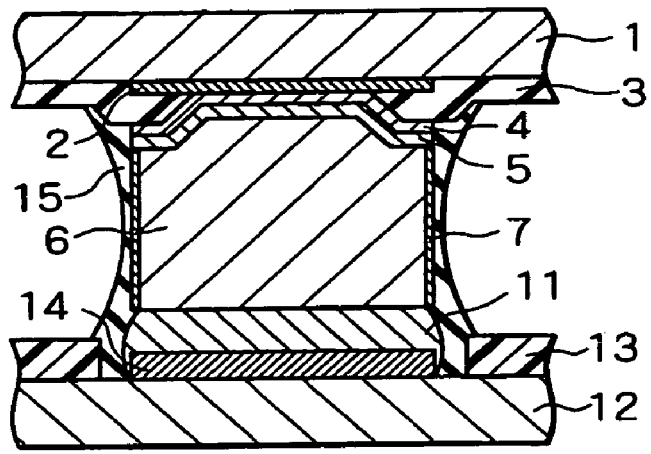
Figure 19C:
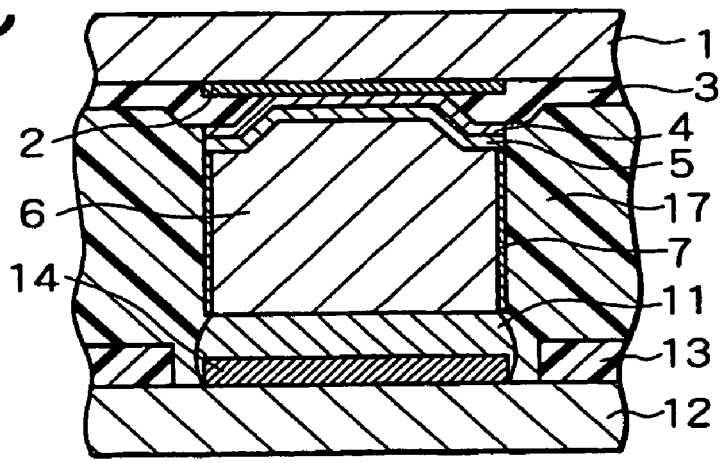

FIGS. 19A to 19C is a cross-sectional view of a process order showing a first embodiment of a producing method for a semiconductor device of this invention. This embodiment relates to a packaging method for a semiconductor element shown in FIG. 1. Flux 15 is supplied to a tip part of a columnar bump 6 of a semiconductor element. In addition, a solder film 16 is formed on a pad 14 of a wiring substrate 12 beforehand, as shown in FIG. 19A. After aligning a semiconductor element so that the columnar bump 6 may be located on a pad 14, a semiconductor element is carried on the wiring substrate 12, to be subjected to solder reflow process, and a columnar bump 6 is joined to a pad 14 through solder fillet 11, as shown in FIG. 19 B. Then, cleaning and removing flux 15 is performed before filled up with underfill resin 17, and cured, as shown in FIG. 19C.

A solder film 16 may be a solder paste layer, or may be a solder reflow layer. Tin/eutectic lead solder is preferably used for solder film 16, but is not limited thereto. Tin/lead (except for eutectic), tin/silver, tin/copper, tin/zinc, and alloy in which other addition elements are added to such material, further can be used.

In this embodiment, flux 15 was applied to a columnar bump 6 side surface. Instead of this, flux 15 may be applied on a solder film 16 or a pad 14. The same thing is said about other embodiment. Also, in a soldering process of this embodiment, a semiconductor element is preferably pressed to a wiring substrate side surface by predetermined pressure. Whereby, constriction structure which collects stress can be avoided.

Figure 20A:
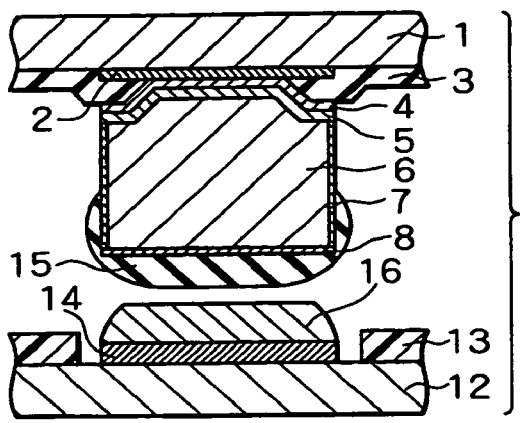
FIG. 20 is a cross sectional view of a second embodiment of a producing method for a semiconductor device of this invention.
Figure 20B:
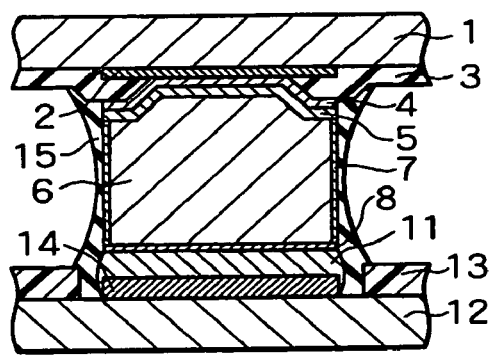
Figure 20B:
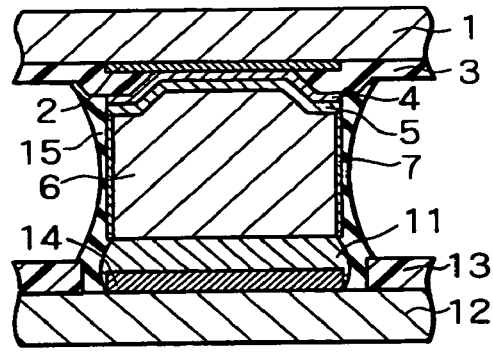
Figure 20C:
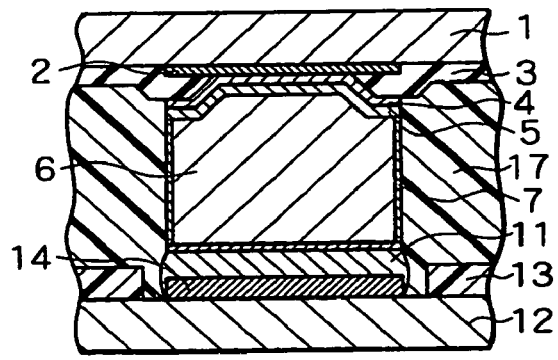
Figure 20C:
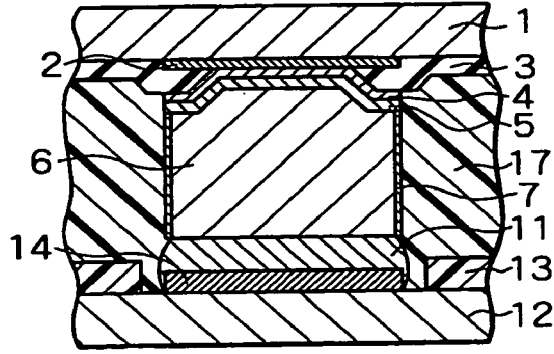

FIGS. 20A to 20C are cross-sectional views of a process order showing a second embodiment of a producing method for a semiconductor device of this invention. This embodiment relates to a packaging method for a semiconductor element shown in FIG. 2. Difference from a first embodiment shown in FIG. 19 resides in a formation such that a cap film 8 is formed on an upper surface of a columnar bump 6. Incidentally, when the cap film 8 is formed with a resin film which melts in a thin gold (or gold alloy) film or flux, since the cap film 8 melts in solder or flux at the time of solder melting, this cap film 8 disappears after solder reflow process is over as shown in FIGS. 20B' and 20C'.

Figure 21A:
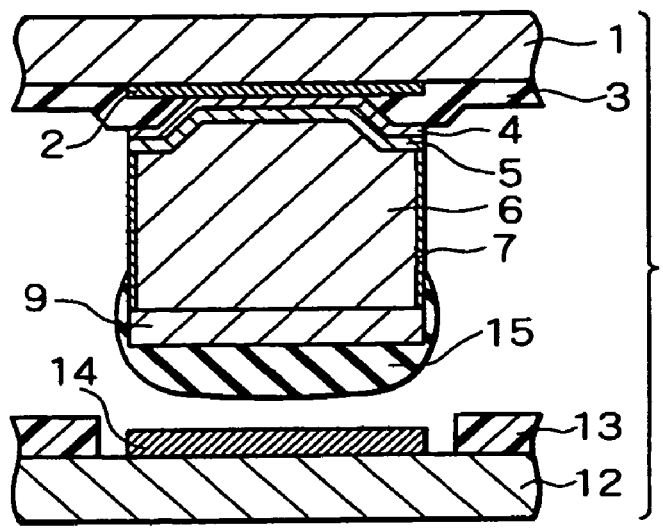
FIG. 21 is a cross sectional view of a third embodiment of a producing method for a semiconductor device of this invention.
Figure 21B:
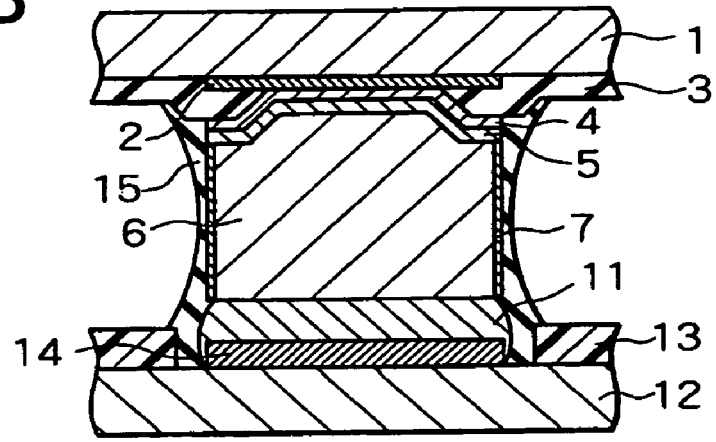
Figure 21C:
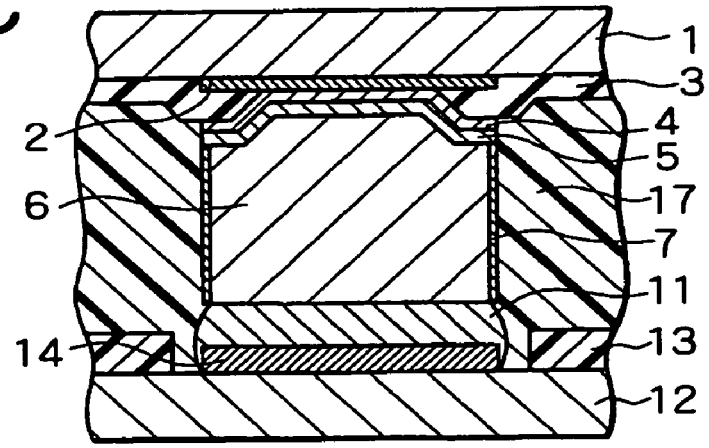
Figure 22A:
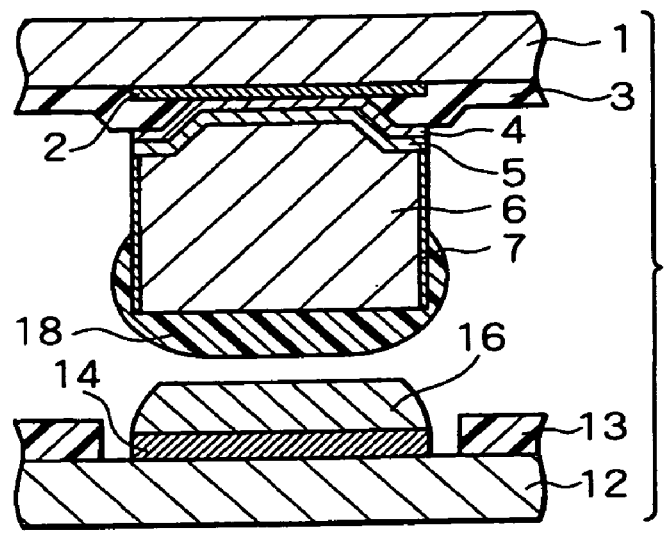
FIG. 22 is a cross sectional view of a fourth embodiment of a producing method for a semiconductor device of this invention.
Figure 22B:
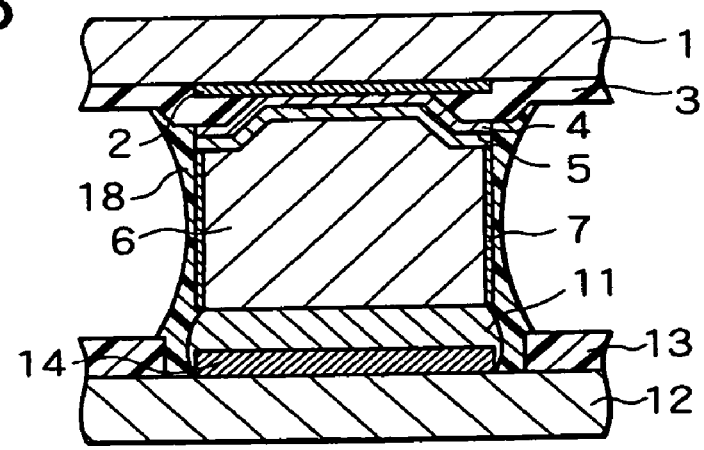
Figure 22C:
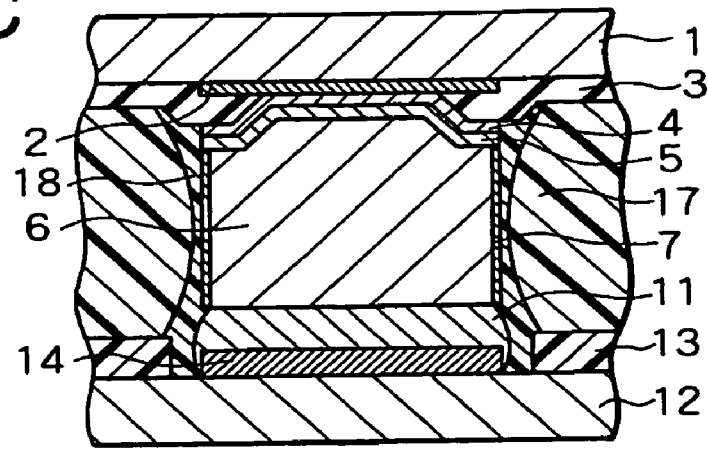

FIGS. 21A to 21C are cross-sectional views of a process order showing a third embodiment of a producing method for a semiconductor device of this invention. This embodiment relates to a packaging method for a semiconductor element shown in FIG. 4. Flux 15 is applied to a tip part of a columnar bump 6, as shown in FIG. 21 A having a solder plating film 9 formed only on the upper surface thereof, a semiconductor element is carried on a wiring substrate after alignment, and solder reflow process produces a solder fillet 11, as shown in FIG. 21B. Subsequent processing is the same as that of the first embodiment shown in FIG. 19. FIGS. 22A to 22C are cross-sectional views of a process order of a fourth embodiment of a producing method for a semiconductor device of this invention. This embodiment relates to a packaging method for a semiconductor element shown in FIG. 1. Difference from a first embodiment shown in FIG. 19 resides in a formation such that instead of flux, a thermosetting resin (henceforth, activity resin) having flux activity effect is used for soldering. Namely, activity resin 18 is supplied to a tip part of a columnar bump 6 of a semiconductor element, and further, a solder film 16 is formed on a pad 14 of a wiring substrate 12 beforehand, as shown in FIG. 22A. After alignment, a semiconductor element is carried on a wiring substrate 12, then subjected to solder reflow process, and a columnar bump 6 is joined to a pad 14 through solder fillet 11, as shown in FIG. 22B, then filled up with underfill resin 17 and cured, with activity resin 18 left, as shown in FIG. 22C.

In this embodiment, activity resin 18 is applied to a columnar bump 6 side surface. However, replacing this, application may be carried out onto a solder film 16 or a pad 14. The same is said of other embodiments.

Figure 23A:
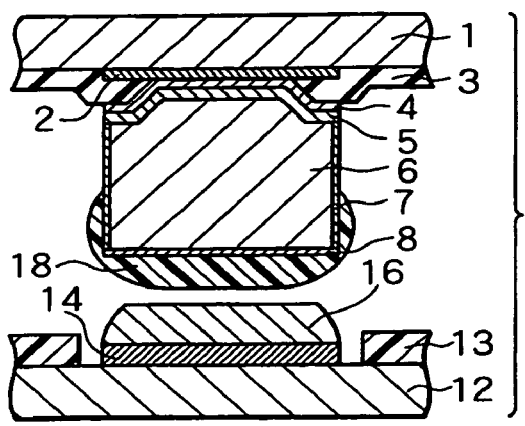
FIG. 23 is a cross sectional view of a fifth embodiment of a producing method for a semiconductor device of this invention.
Figure 23B:
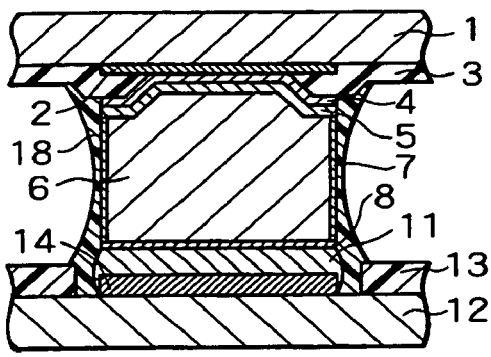
Figure 23B:
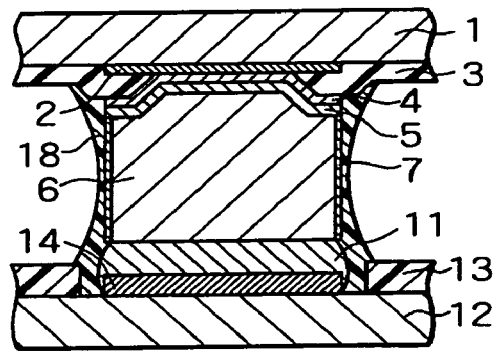
Figure 23C:
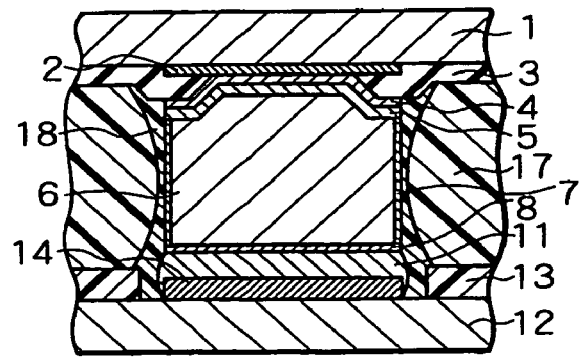
Figure 23C:
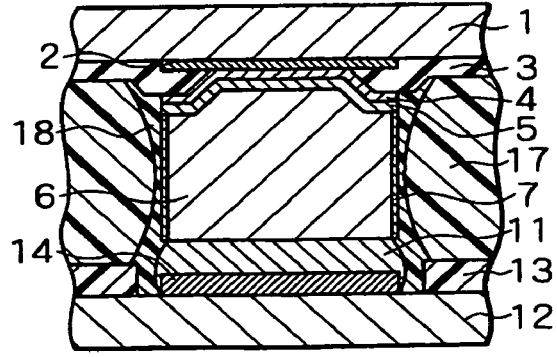

FIGS. 23A to 23C are cross-sectional views of a process order showing a fifth embodiment of a producing method for a semiconductor device of this invention. This embodiment relates to a packaging method for a semiconductor element shown in FIG. 2. Difference from a second embodiment shown in FIG. 20 resides only in soldering by use of activity resin 18, to thereby omit a detailed explanation. Incidentally, when a cap film 8 is formed of a thin gold film (or gold alloy) or a resin film which dissolves in flux, the cap film 8 melts in solder or activity resin at the time of solder fusion. Hence, after solder reflow process is over, as shown in FIGS. 23B' and C', the cap film 8 disappears.

Figure 24A:
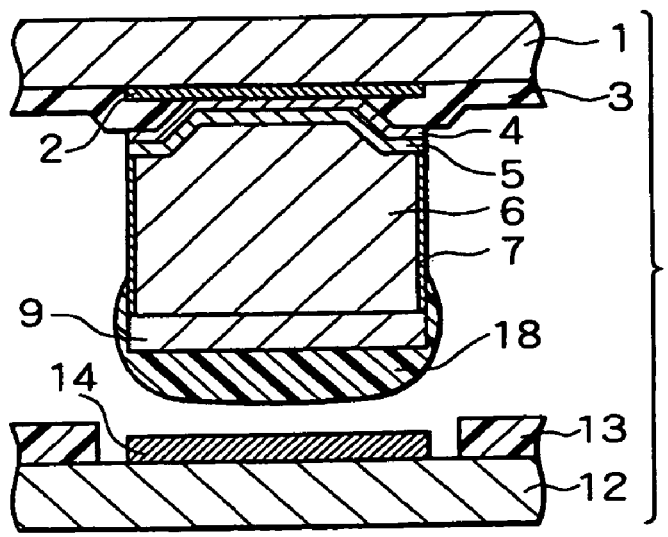
FIG. 24 is a cross sectional view of a sixth embodiment of a producing method for a semiconductor device of this invention.
Figure 24B:
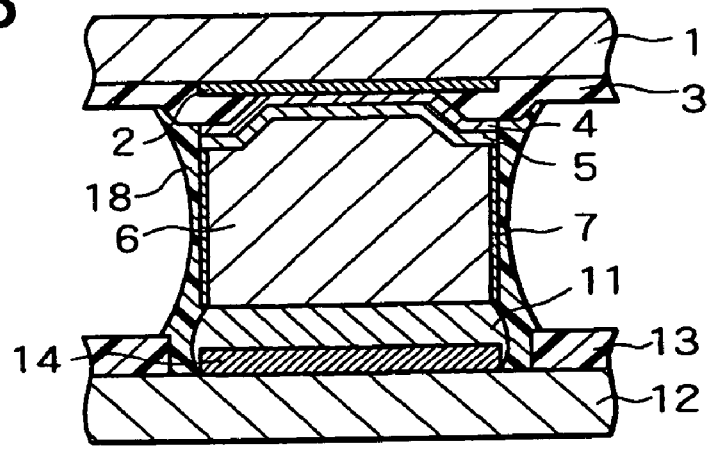
Figure 24C:
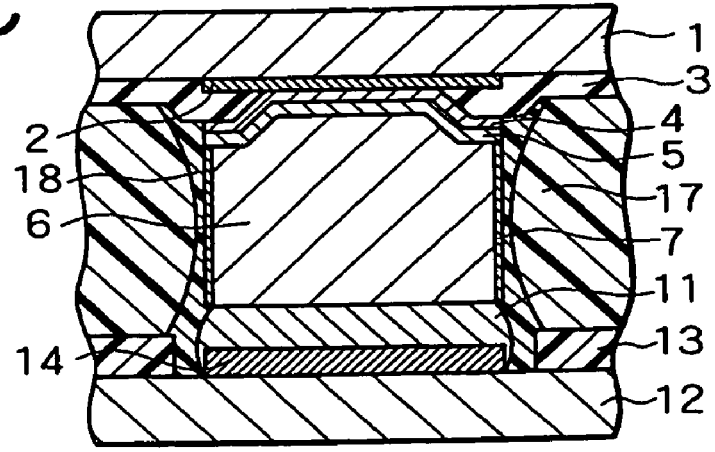

FIGS. 24A to 24C are cross-sectional views of a process order showing a sixth embodiment of a producing method for a semiconductor device of this invention. This embodiment relates to a packaging method for a semiconductor element shown in FIG. 4. Difference from a third embodiment shown in FIG. 21 of this embodiment resides in only soldering by use of an activity resin 18 replacing flux. Therefore, a detailed explanation will be omitted.

Figure 25A:
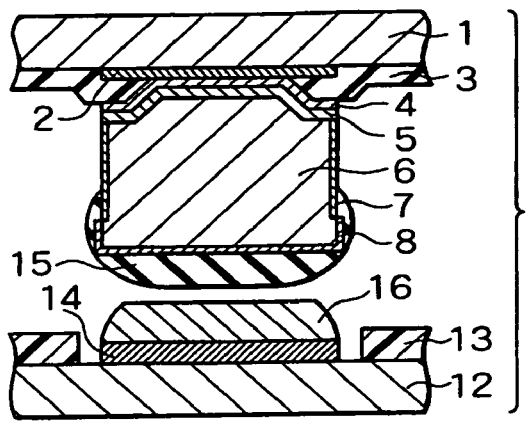
FIG. 25 is a cross sectional view of a seventh embodiment of a producing method for a semiconductor device of this invention.
Figure 25B:
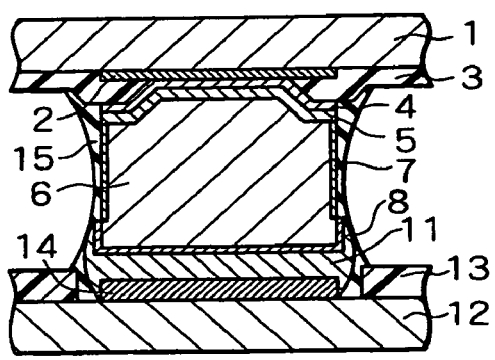
Figure 25B:
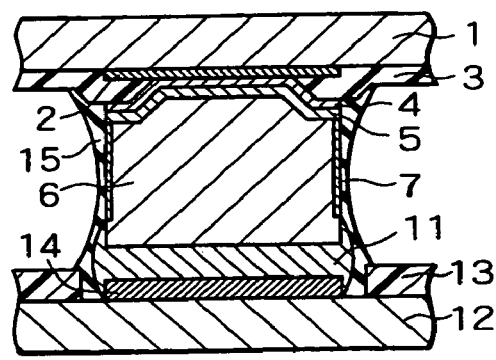
Figure 25C:
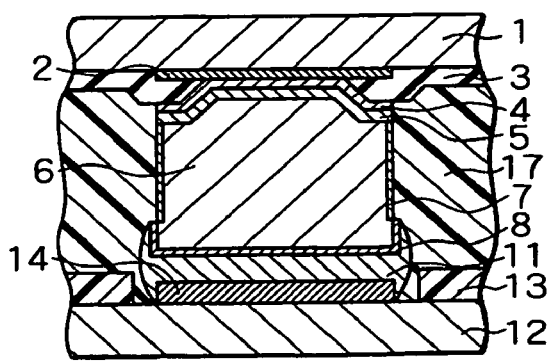
Figure 25C:
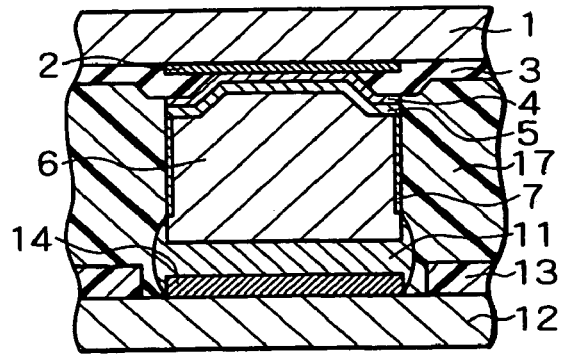

FIGS. 25A to 25C are cross-sectional views of a seventh embodiment of a producing method for a semiconductor device of this invention. This embodiment relates to a packaging method for a semiconductor element shown in FIG. 3. Flux 15 is supplied to a tip part of a columnar bump 6 having a cap film 8 formed on a part of upper surface and side surface, forming a solder film 16 on a pad 14 of a wiring substrate 12 beforehand. [FIG. 25A]. After alignment, a semiconductor element is carried on a wiring substrate 12, and subjected to reflow soldering process. Then, solder gets wet upwardly along a cap film 8 so as to allow a fillet 11 to be formed as far as a columnar bump 6 side surface, a shown in FIG. 25B. And cleaning and removing a flux 15 is performed, before filled up with an underfill resin 17 and cured, as shown in FIG. 25C. Incidentally, when the cap film 8 is formed with a resin film which melts in a thin gold (or gold alloy) film or flux, since the cap film 8 melts in solder or flux at the time of solder melting, it disappears after solder reflow process is over as shown in FIGS. 25B' and 25C'.

Figure 26A:
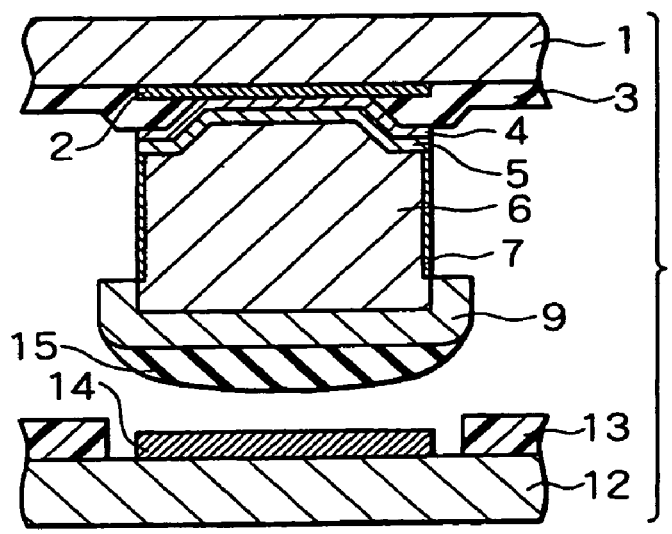
FIG. 26 is a cross sectional view of a eighth embodiment of a producing method for a semiconductor device of this invention.
Figure 26B:
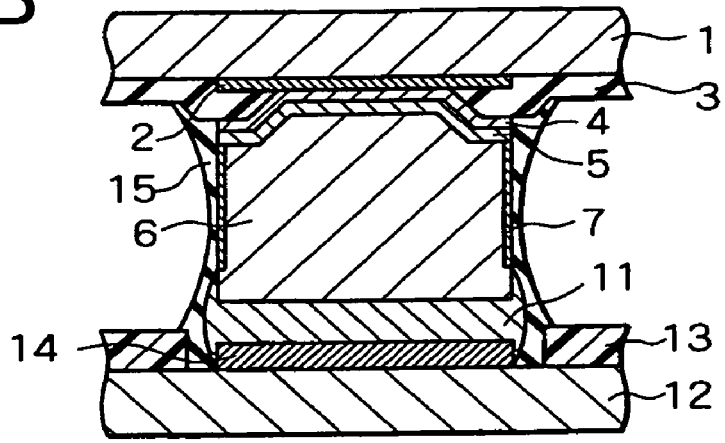
Figure 26C:
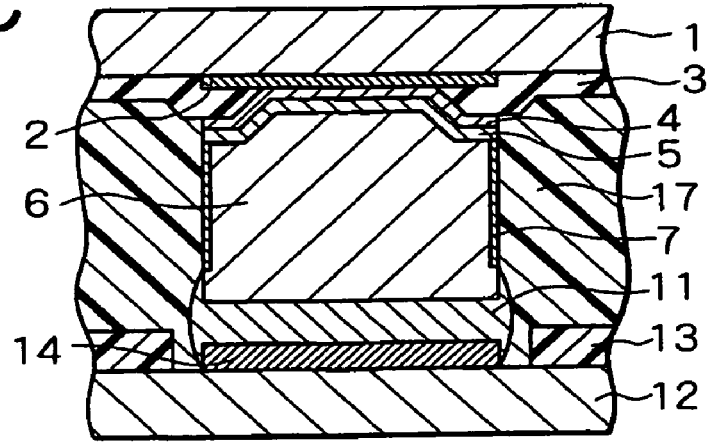
Figure 27A:
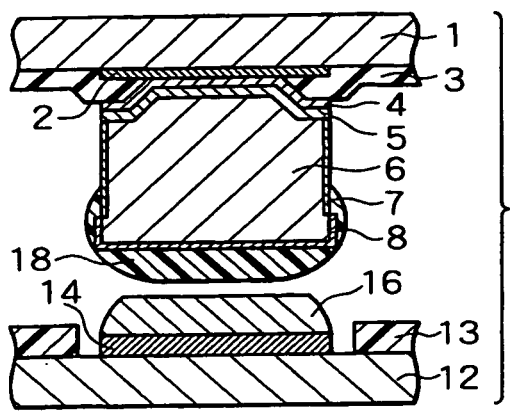
FIG. 27 is a cross sectional view of a ninth embodiment of a producing method for a semiconductor device of this invention.
Figure 27B:
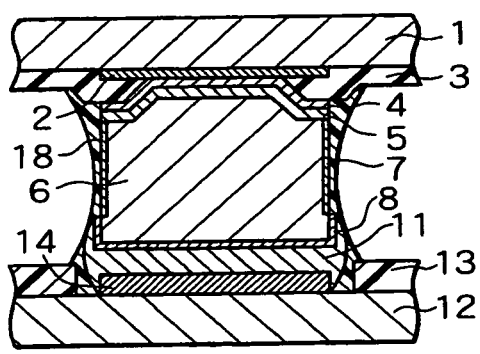
Figure 27B:
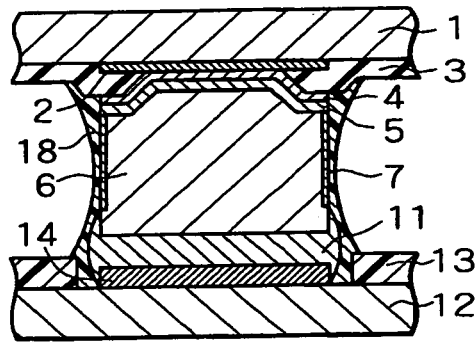
Figure 27C:
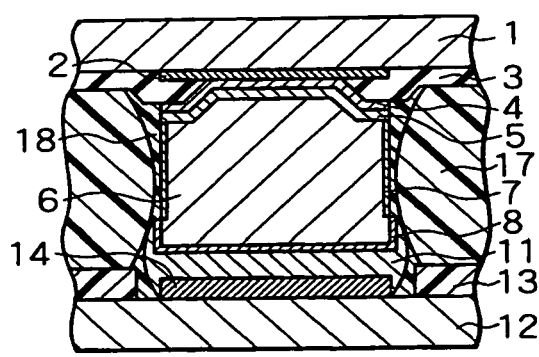
Figure 27C:
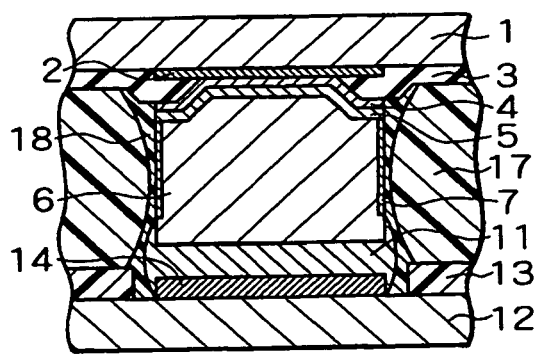

FIGS. 26A to 26C are cross-sectional views of a process order showing an eighth embodiment of a producing method for a semiconductor device of this invention. This embodiment relates to a packaging method for a semiconductor element shown in FIG. 5. Since this embodiment is the same as a third embodiment shown in FIG. 21 except for the point that the solder plating film is formed on a part of a columnar bump 6 side surface, detailed explanation is omitted.

FIGS. 27 A to 27C are cross-sectional views of a process order showing a ninth embodiment of a semiconductor element of this invention. This embodiment relates to a packaging method for a semiconductor element shown in FIG. 3. Difference from a seventh embodiment shown in FIG. 25 of this embodiment resides only in soldering by use of an active resin 18 replacing flux, to thereby omit a detailed explanation. Incidentally, when a cap film 8 is formed with a resin film which melts in a thin gold (or gold alloy) film or flux, since the cap film 8 melts in solder or flux at the time of solder melting, this cap film 8 disappears after solder reflow process is over as shown in FIG. 27 B' and C'.

FIGS. 28A to 28C are cross-sectional views of a process order showing a tenth embodiment of a producing method for a semiconductor device of this invention. This embodiment relates to a packaging method for a semiconductor element shown in FIG. 5. Difference from an eighth embodiment shown in FIG. 26 of this embodiment resides only in soldering by use of an active resin 18, replacing flux, thereby to omit a detailed explanation.

In seventh embodiment to eleventh embodiment, referring to an oxide film removal capability of flux or an activity resin, and the supply amount, in order to acquire a fillet form where solder gets wet upwardly to a part of a columnar bump side, which is a characteristic structure of this embodiment, adjustment is needed to be preferably carried out as needed.

Figure 29A:
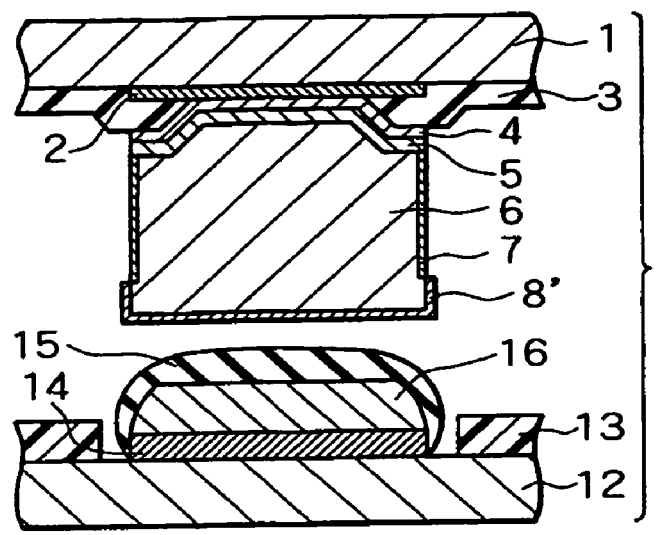
FIG. 29 is a cross sectional view of a eleventh embodiment of a producing method for a semiconductor device of this invention.
Figure 29B:
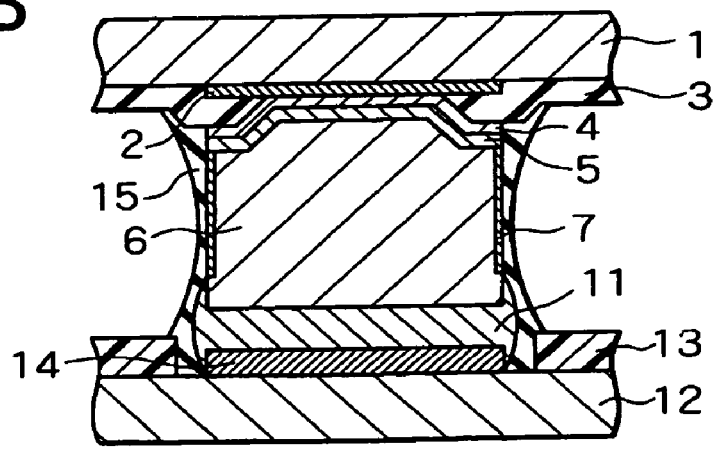
Figure 29C:
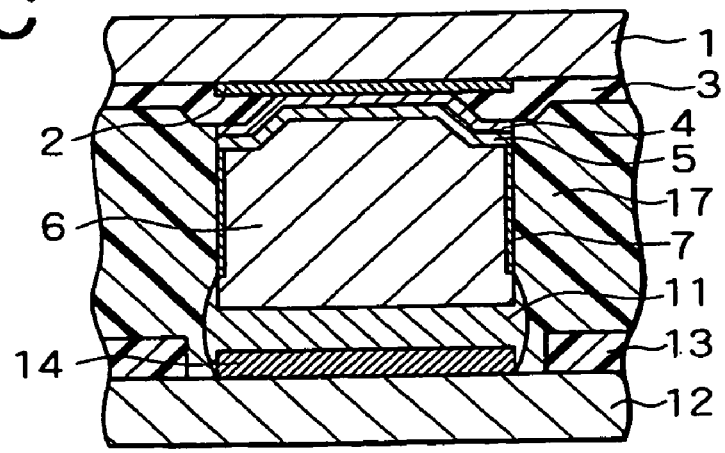

FIGS. 29 A to 29C are cross-sectional views of a process order showing an eleventh embodiment of a producing method for a semiconductor device of this invention. The upper surface or upper portion of the side of a columnar bump 6 of a semiconductor element used in this embodiment, is coated with a cap film 8' composed of a resin material which melts in flux at the time of soldering. A junction part of the columnar bump 6 is not oxidized in an ambient atmosphere, and is maintained in a clean state. Flux is applied beforehand on a solder film 16 formed on a pad 14 of a wiring substrate 12, as shown in FIG. 29A. After alignment a semiconductor element so that a columnar bump 6 may be located on a pad 14, if a semiconductor element is carried on the wiring substrate 12 and subjected to solder reflow process, a cap film 8' melts, junction part of the columnar bump 6 is exposed, and the columnar bump 6 is soldered to the pad 14, as shown in FIG. 29 B. Then, cleaning and removing flux 15 is performed, before filled up with underfill resin 17 and cured, as shown in FIG. 29 C.

Flux 15 was applied to a solder film 16 in this embodiment. However, replacing this, application may be carried out onto a columnar bump 6 side surface. Also, replacing flux, an activity resin having a flux action may be used.

In a seventh embodiment to a eleventh embodiment, referring to an oxide film removal capability and a supply amount of flux or activity resin, it is necessary to adjust suitably to obtain a fillet form in which solder gets wet upwardly as far as a part of a columnar bump side, which is a characteristic form of this embodiment. That is, what is important to obtain a necessary junction form in a semiconductor device manufacture process of this invention is whether a suitable quantity is supplied by flux, while activity resin has a suitable removal capability of oxide film. If oxide film removal capability is too strong, solder gets wet upwardly as far as a root of a columnar bump which is not wanted to be wet and assumes the form in which solder wraps the columnar bump. Then, such a possibility arises as solder advancing between the columnar bump and an adhesive film, or an adhesive film and an interconnected film, reducing adhesion intensity, and resulting in exfoliation. Also, if oxide film removal capability is too weak, stable metal junction is not carried out in the interface of solder with a copper bump, with a result that connecting becomes poor. Accordingly, it is important to select flux or activity resin with suitable oxide film removal capability and supply a suitable quantity uniformly.

However, in soldering of a semiconductor element of this invention, flux or activity resin is not indispensable, and when a junction interface and a solder film surface are kept clean enough, the semiconductor element can also be soldered without using these. The following twelfth and thirteenth embodiment relate to a soldering method for not using flux or activity resin.

Figure 30A:
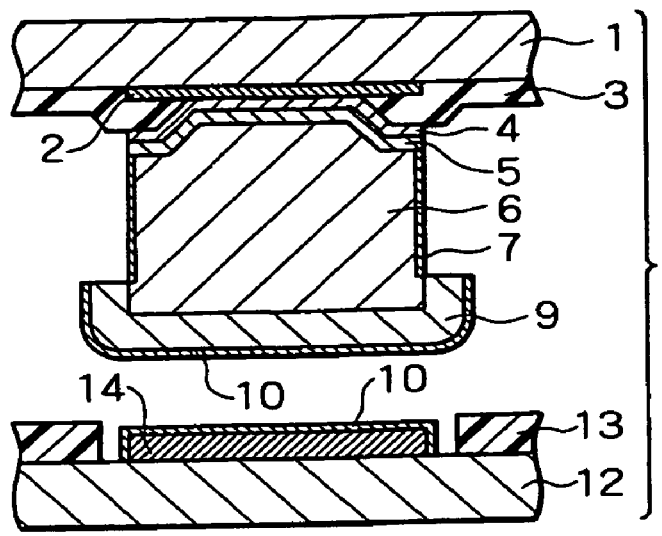
FIG. 30 is a cross sectional view of a twelfth embodiment of a producing method for a semiconductor device of this invention.
Figure 30B:
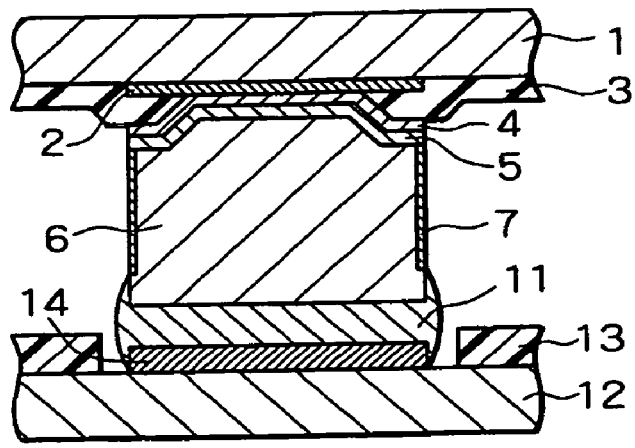
Figure 30C:
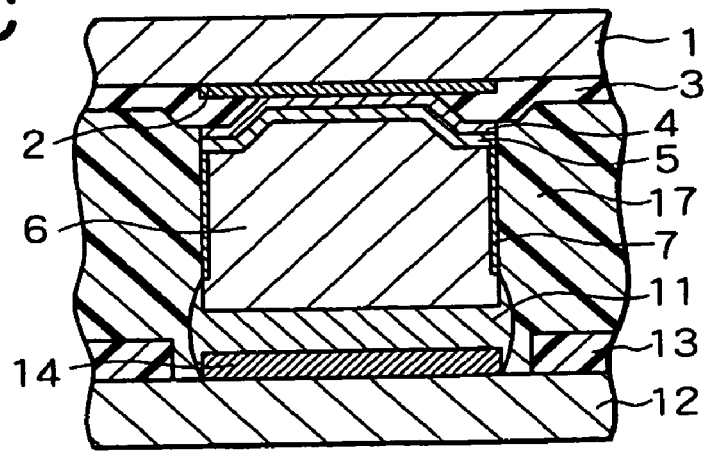

FIGS. 30A to 30C are cross-sectional views of a process order showing a twelfth embodiment of a producing method for a semiconductor device of this invention. This embodiment relates to a packaging method for a semiconductor element shown in FIG. 7. In this embodiment, while gold film 10 is formed on the surface of the solder plating film 9 provided on an upper part of a columnar projection 6, gold film 10 is formed also on a pad 14, as shown in FIG. 30 A. By forming these gold films, the surface of a solder plating film 9 and a pad 14 is held in a clean state without oxidizing. After aligning a semiconductor element so that the columnar bump 6 may be located on the pad 14, if a semiconductor element is carried on a wiring substrate 12 and subjected to solder reflow process, the gold film 10 melts in solder and the columnar bump 6 is joined to the pad 14 through solder fillet 11, as shown in FIG. 30B, then filled up with the underfill resin 17 thereafter and cured, as shown in FIG. 30C.

In this embodiment, gold films 10 are formed on both solder plating film 9 and pad 14. However, only either of them may be sufficient. In this case, a series of process of storage, conveyance, and packaging is carried out in non-oxidizing atmosphere, such as a vacuum and reductive atmosphere. Whereby, it is important that the junction part surface is made not to be polluted.

Figure 31A:
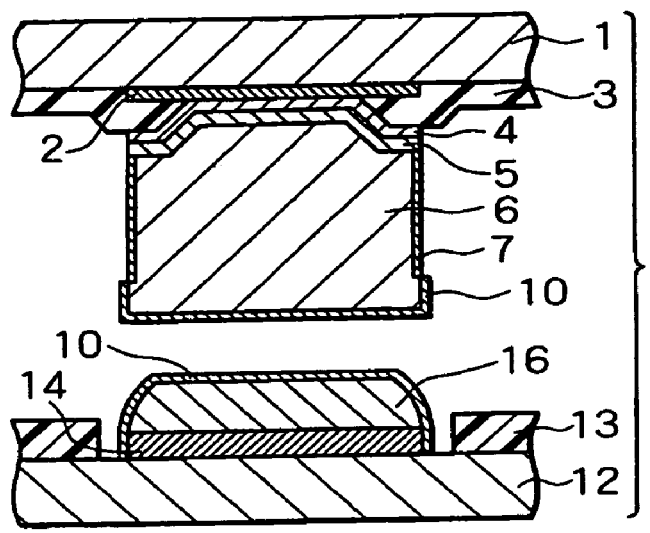
FIG. 31 is a cross sectional view of a thirteenth embodiment of a producing method for a semiconductor device of this invention.
Figure 31B:
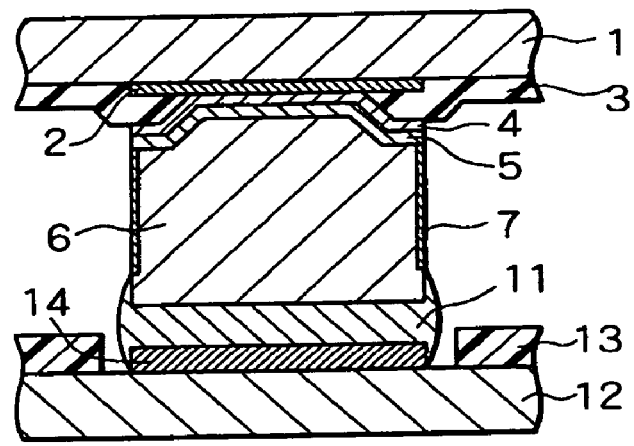
Figure 31C:
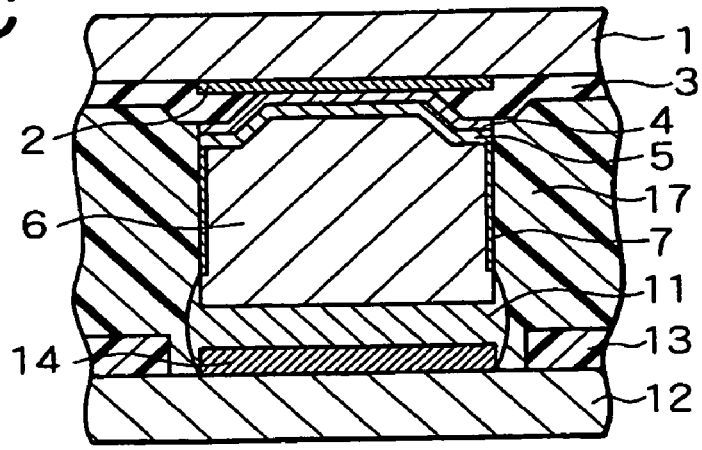

FIGS. 31A to 31C is a cross-sectional view of a process order showing a thirteenth embodiment of a producing method for a semiconductor device of this invention. The top surface and upper part of the side of a columnar bump 6 of semiconductor element of the embodiment of this invention is covered by thin gold film 10. Gold film 10 is formed also on a solder film surface 16 of a pad 14 as shown in FIG. 31A. After alignment, a semiconductor element is carried on a wiring substrate 12 and subjected to solder reflow process, the gold film 10 melts in solder and the columnar bump 6 is joined to the pad 14 through solder fillet 11 as shown in FIG. 31B, then filled up with the underfill resin 17 thereafter and cured as shown in FIG. 31C.

This embodiment relates to a packaging method for a semiconductor element shown in FIG. 7. In this embodiment, while gold film 10 is formed on the surface of the solder plating film 9 provided on an upper part of a columnar projection 6, gold film 10 is formed also on a pad 14 as shown in FIG. 30 A. By forming these gold films, the surface of a solder plating film 9 and a pad 14 is held in a clean state without oxidizing. After aligning a semiconductor element so that the columnar bump 6 may be located on the pad 14, if a semiconductor element is carried on a wiring substrate 12 an d subjected to solder reflow process, the gold film 10 melts in solder and the columnar bump 6 is joined to the pad 14 through solder fillet 11 as shown in FIG. 30B, then filled up with the underfill resin 17 thereafter and cured as shown in FIG. 30C.

Figure 32A:
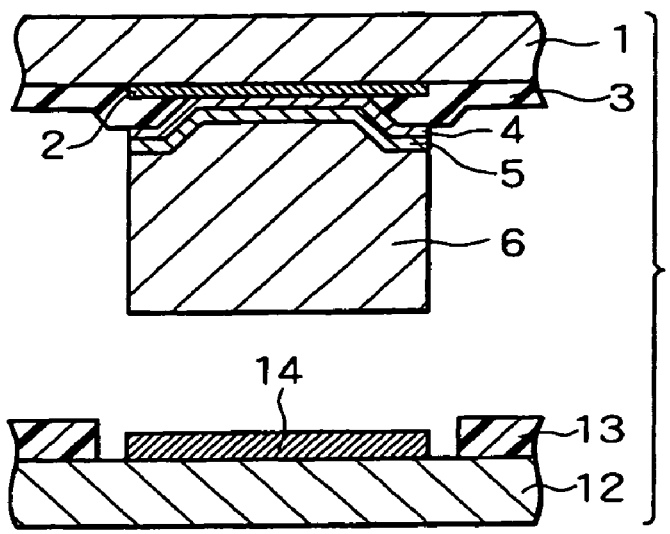
FIG. 32 is a cross sectional view of a fourteenth embodiment of a producing method for a semiconductor device of this invention.
Figure 32B:
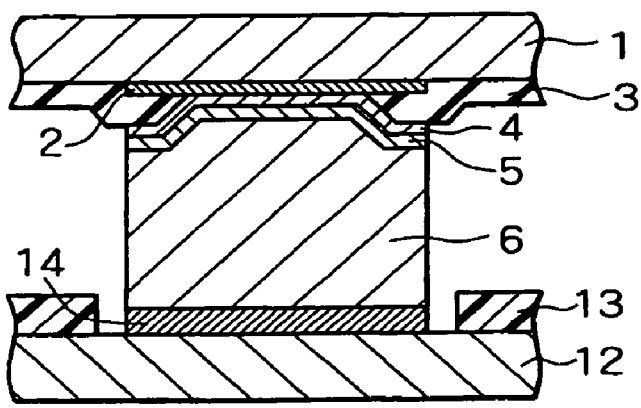
Figure 32C:
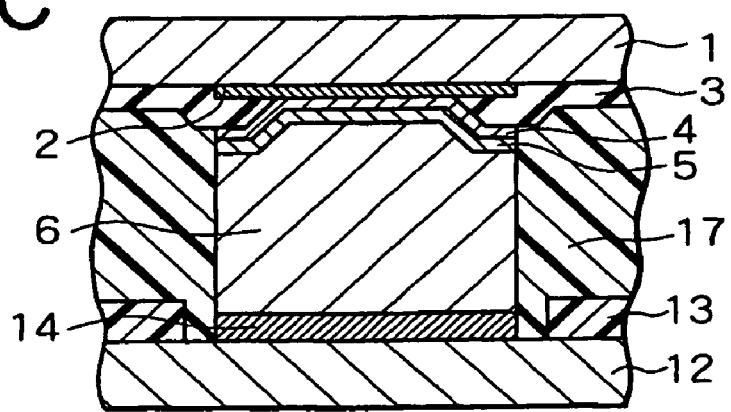

FIGS. 32A to 32C are cross-sectional views of a process order showing a fourteenth embodiment of a producing method for a semiconductor device of this invention. The surface of a semiconductor element and a wiring substrate is exposed in the plasma atmosphere of inactive gas, such as argon, and the junction side of a pad 14 with a columnar bump 6 is made clean as shown in FIG. 32A. After alignment, the semiconductor element is carried on a wiring substrate 12, pressurized and the columnar bump 6 tip part is stuck to the pad 14 by pressure as shown in FIG. 32B. At this time, either of the means of heating or ultrasonic wave, or combined use of the both may be adopted. Then, underfill resin 17 is poured in and cured as shown in FIG. 32C.

Figure 33A:
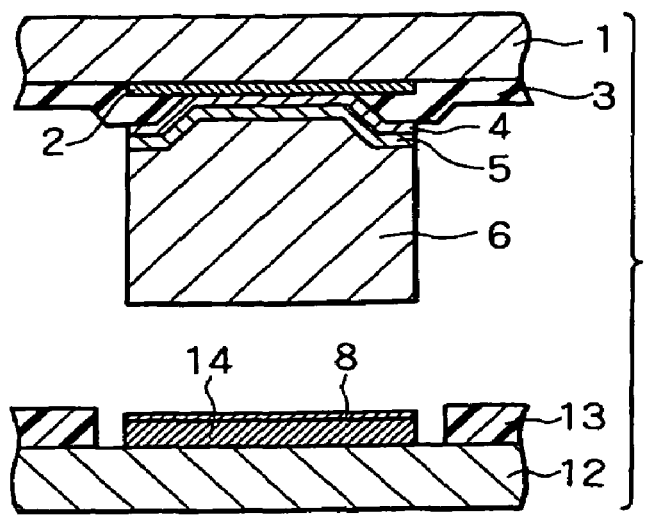
FIG. 33 is a cross sectional view of a fifteenth embodiment of a producing method for a semiconductor device of this invention.
Figure 33B:
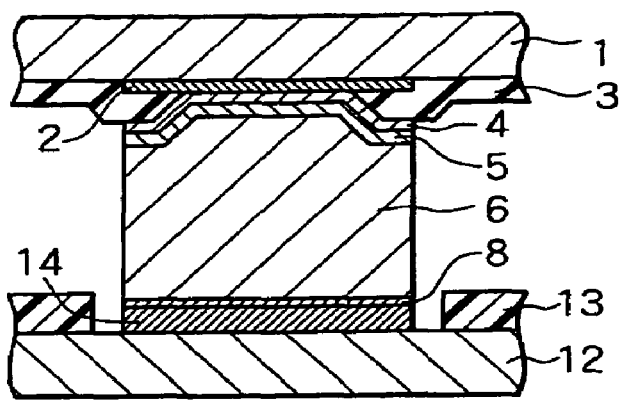
Figure 33C:
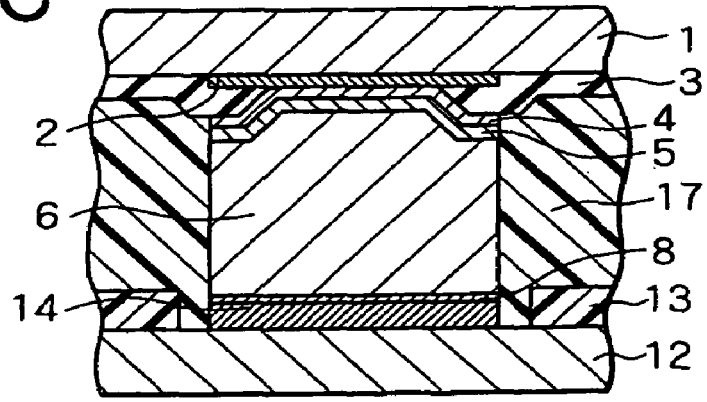

FIGS. 33 A to 33C are cross-sectional views of a process order showing a fifteenth embodiment of a producing method for a semiconductor device of this invention. In this embodiment, a cap film 8 composed of gold etc. is formed beforehand on a pad 14 of a wiring substrate. Difference from an eleventh embodiment shown in FIG. 32 in this embodiment resides only in a form such that the cap film 8 is formed on the pad 14, to thereby omit a detailed explanation.

In this embodiment, a cap film 8 was formed only in the pad side of a wiring substrate, the cap film can be conversely formed only in a columnar bump side. Also, like an eleventh embodiment and a twelfth embodiment, when a cap film is not formed on at least one junction side surface, the junction can more preferably be performed in a vacuum or non-oxidizing atmosphere. That is, it is more preferable to maintain environment in a vacuum or non-oxidizing atmosphere state from a cleaning processing until junction is performed by plasma.

Figure 34A:
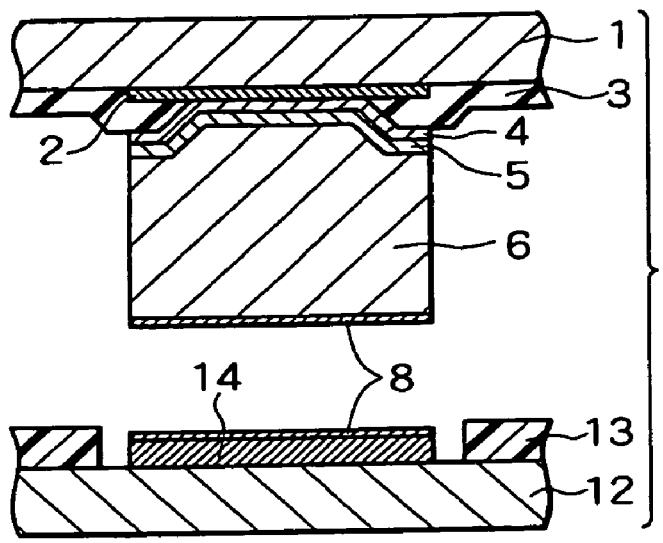
FIG. 34 is a cross sectional view of a sixteenth embodiment of a producing method for a semiconductor device of this invention.
Figure 34B:
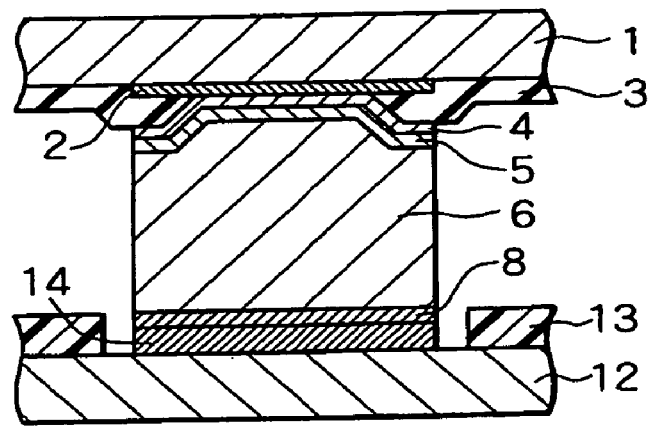
Figure 34C:
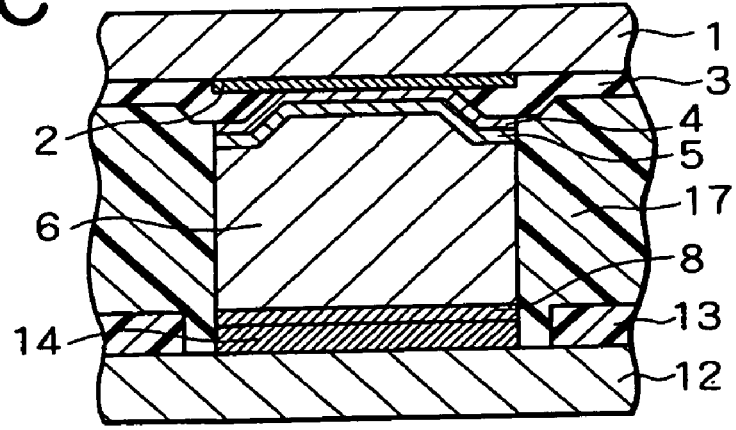
Figure 35:
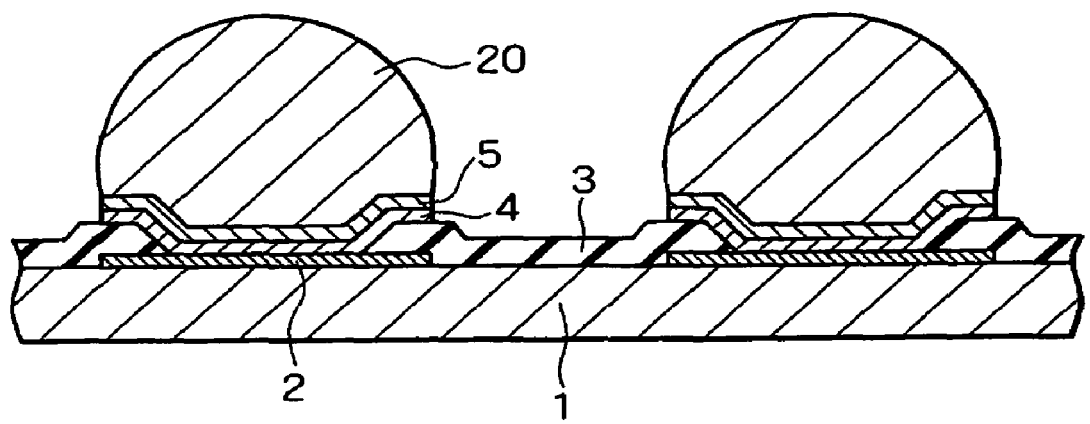
FIG. 35 is a cross-sectional view of a conventional example of a semiconductor element.
Figure 36:
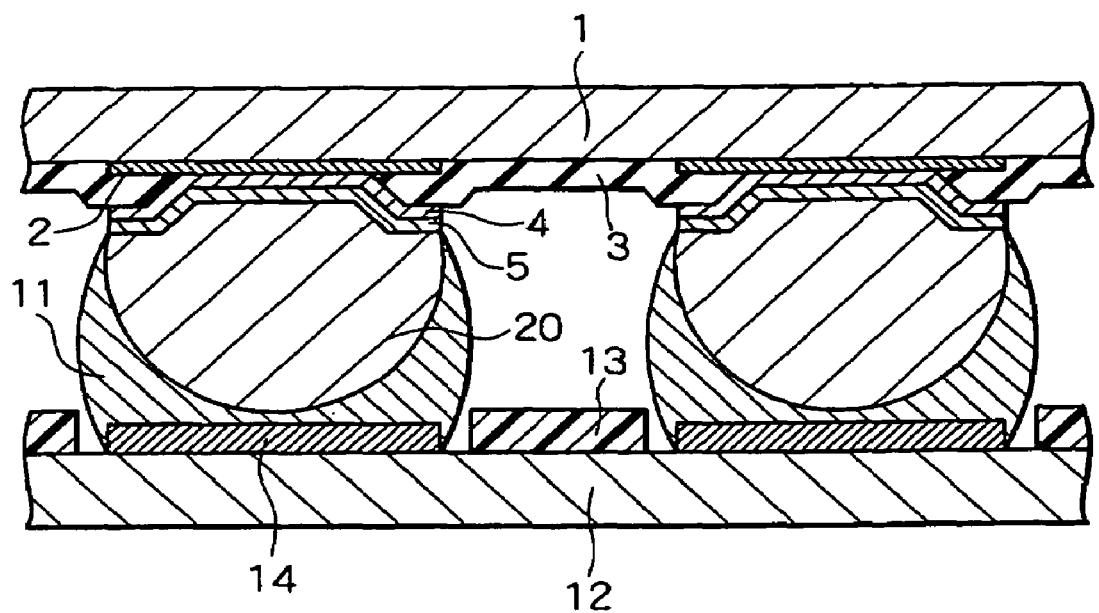
FIG. 36 is a conventional view of a conventional example of a semiconductor device.

FIGS. 34A to 34C are cross-sectional views of a process order showing a sixteenth embodiment of a producing method for a semiconductor device of this invention. In this embodiment, for a semiconductor element, a cap film 8 is formed on an upper surface of a columnar bump 6, and the cap film 8 is also prepared on a pad 14 of a wiring substrate beforehand. Difference from a eleventh embodiment shown in FIG. 32 in this embodiment resides only in a formation such that the cap film 8 is formed on the columnar bump 6 or the pad 14, to thereby omit a detailed explanation. (see example 3)

Now examples of the present invention will be explained in conjunction with the drawings.

EXAMPLE 1

Referring to an example 1 of this invention, a producing method for a semiconductor element will now be described with reference to FIG. 9.

First, a cover film 3 of a silicon oxide film is formed on a wiring layer of the aluminum alloy formed on a semiconductor substrate 1, and a cover coat removal on an electrode 2 formed on the wiring layer tip part is carried out. Next, titanium as an interconnected film 4, and a copper film as an adhesive film 5 are formed on the whole surface in a orderly manner by sputtering. Thickness of the cover coat film is determined as 4.5 µm, thickness of the interconnected film is determined as 60 nm, and thickness of the adhesive film is determined as 500 nm. Next, a plating resist film 19 is formed and copper is deposited as a columnar bump 6 by electrolytic plating. At this time, the size of the columnar bump is determined as about 140 µm in diameter, and about 90 µm in height. Subsequently, gold-plating is carried out and the cap film 8 of about 0.1 µm thickness is formed on the columnar bump upper surface. And after exfoliating plating resist, unnecessary portions of an adhesive film and an interconnected film are removed by wet etching, using a copper bump as a mask. Then after being subjected to heat-treatment in oxidizing atmosphere, and a wet prevention film 7 is formed on a columnar bump side, copper columnar bump formation is completed. The wet prevention film 7 may be formed immediately after plating resist exfoliation.

Next, a packaging method onto a wiring substrate of a semiconductor element which has a copper columnar bump will be explained with reference to FIG. 20. First, flux 15 is uniformly applied in about 40 µm thickness by squeezing on smooth and flat plates such as a glass board. Then, a columnar bump is pushed and flux is transferred to a tip. A method for making flux being transferred may be a pin transferring method which transfers the flux on a pin. The method is not restrained in the range in which the stable supply to a tip of a copper bump is possible. And a semiconductor chip is mounted onto a wiring substrate thereafter. Tin/eutectic lead alloy solder paste is supplied to the wiring substrate beforehand by printing on a pad part. Then after solder reflow process, the plate is pushed in parallel with a board surface and the solder upper part is crushed, so that the height may be uniform. Next, after aligning a semiconductor element so that a columnar bump may be located on a pad of a wiring substrate, the semiconductor element is carried on a wiring substrate. Then with the semiconductor element subjected to solder reflow process and pressed simultaneously, a columnar bump 6 is connected to a pad 14 of a wiring substrate. As for a junction form of a semiconductor element and a wiring substrate, a cap film which is good in solder wettability is formed only on an upper surface of a columnar bump. And since wet prevention film is formed on the side surface, solder does not turn around to the side and only an upper surface of a columnar bump joins to the pad. Namely, a solder does not get wet upwardly of a columnar bump as far as the part between the columnar bump and an adhesive film, or between the adhesive film and an interconnected film, resulting in junction strength fall, nor constituting a stress concentration part like constriction form. This contributes to having a reliable structure. Next, after cleaning and removing flux 15, underfill resin 17 is poured in from the side. Then, after filling and curing, packaging of a semiconductor element is completed. In this embodiment, solder paste is supplied to the wiring substrate first to be melted and solidified once thereon, before the flip chip is mounted thereto. However, without melting and solidifying solder paste, the flip chip can also be carried in and joined.

EXAMPLE 2

As for a second example of the present invention, a producing method for a semiconductor element will be explained in conjunction with FIG. 10. In a similar manner to a first embodiment, as shown in FIG. 10B, on an electrode 2, an interconnected film of 60 nm in thickness, and an adhesive film of 500 nm in thickness, and a columnar bump 6 with diameter of about 140 µm and height of 90 µm, are formed, then subjected to etching processing by oxygen plasma onto a plating resist film 19. Then, an upper portion of the columnar bump is exposed by about 15 µm and plated with gold, to thereby form a cap film 8 of about 0.1 µm in thickness. Subsequently, plating resist is exfoliated and chemical removal of the unnecessary portions of an adhesive film and an interconnected film is carried out by wet etching using a columnar bump as a mask, and subjected to heat treatment in oxidizing atmosphere. A wet prevention film 7 is thus formed on a copper columnar bump side surface. Next, a packaging method onto a wiring substrate of a semiconductor element having a columnar bump formed in an aforementioned manner will be explained in conjunction with FIG. 25. As shown in FIG. 25A, a solder film 16 is formed on a pad of the wiring substrate beforehand and along with this, flux 15 is applied to a tip part of a columnar bump 6. Next, after aligning a semiconductor element so that a columnar bump may be located on a pad of a wiring substrate, the semiconductor element is carried on a wiring substrate. Then with a semiconductor element subjected to solder reflow process and pressed simultaneously, a columnar bump 6 is connected to a pad 14 of a wiring substrate. As for a junction form of a semiconductor element and a wiring substrate, since a cap film which is good in solder wettability is formed in a part of an upper surface and side surface of a columnar bump, and a wet prevention film is formed on the side surface, so as to be formed in such a manner that solder fillet 11 wraps in an upper portion of the columnar bump. And a situation such that solder gets wet upwardly as far as a base of the columnar bump does not occur. Next, after cleaning and removing flux 15, underfill resin 17 is poured in from the side, to be cured after filling. Packaging of a semiconductor element is thus completed.

EXAMPLE 3

As a third example of the present invention, a producing method for a semiconductor element will now be explained in conjunction with FIG. 12. Similar to a first embodiment, after forming a cover coat, sputtering of chromium/copper as an interconnected film 4, and copper as an adhesive film 5 is performed, so that an interconnected film and an adhesive film may be formed on the whole surface. An interconnected film 4 is defined as 100 nm in thickness, and an adhesive film 5 is defined as 500 nm in thickness. After forming a plating resist film 19 and forming a columnar bump 6 of copper with a diameter of about 140 μm, and a height of about 90 μm by electrolytic plating, etching processing is performed by a dry method and an upper part of the copper bump is exposed using the difference of the etching speed of plating resist and copper. The height of the portion to be exposed was set as about 15 μm. Next, the solder plating layer 9 of the eutetic alloy of 96.5% weight of tin and 3.5% weight of silver is formed on a copper bump by electrolytic plating in the thickness of about 15 μm.

Since the solder plating film 9 is formed also on a columnar bump side surface at this time, control of film thickness is important so that the short-circuit between electrodes may not take place at the time of next fusion connection. Next, plating resist exfoliation is carried out and an excessive interconnected film and adhesive film are removed by wet etching, before subjected to a heat-treatment in oxidizing atmosphere, so that a wet prevention film 7 may be formed on the columnar bump 6 side surface. Then, an oxide film formed on the solder plating film 9 is removed by being subjected to plasma processing.

Next, a packaging method for a semiconductor element formed in the above-described manner onto a wiring substrate will be explained in conjunction with FIG. 28. Activity resin 18 is uniformly applied on the tip of the solder plating film 9 on a copper bump in thickness of about 40 μm, by squeezing on flat and smooth plates such as a glass board. A columnar bump is pushed against this and thermosetting resin (activity resin 18) is transferred on the tip. The method for making activity resin transferred is not restrained in the range in which the stable supply to the tip of columnar bumps such as pin transfer, is possible.

Usually, flux is used for the oxide film removal on the surface of a bump. As for a flux cleaning after packaging, introduction of special cleaning equipment is needed to clean a narrow crevice between a semiconductor element and a wiring substrate. This requires a longer cleaning time and may be considered as a causative factor of pushing up the cost. Moreover, the cleaning residual substance is easy to remain, constituting one factor of a reliability fall. Also, by fine pitch tendency from now on it is expected that crevice cleaning becomes still more difficult. If activity resin is used like this embodiment, it is effective in respect of a reduction of man-hour and plant-and-equipment investment, improvement in the product yield, and improvement in packaging reliability by saving the cleaning.

After applying activity resin 18, a semiconductor element is aligned and carried on a wiring substrate, to be subjected to solder reflow process, and a columnar bump and a pad of a wiring substrate are connected. A crevice is filled up with underfill resin at the end and cured, and the packaging process of a semiconductor element is completed.

Activity resin is transferred and mounted here, flux may be used replacing the activity resin. Also, if gold is thinly plated on the solder film formed on the columnar bump, junction will improve further, to the extent that junction is achieved without using flux.

In this embodiment, very-small-quantity transfer of the activity resin was carried out onto the tip of a bump, and filled up with underfill resin thereafter. If the activity resin with reliability which is higher than equivalent of underfill resin is used, resin filling can also be realized without performing resin pouring in such a manner that a proper quantity of activity resin is supplied to a wiring substrate, a semiconductor chip is carried onto a board, and resin curing is also performed at the time of the solder reflow process. Also, in cases of the embodiments 1 to 3, a resin film may be provided on a pad, solder film, and a solder plating film for the purpose of an oxidation prevention. Furthermore, instead of the flux which was transferred to a bump tip and used for connection, the activity resin having a flux effect which is cured by the quantity of heat at the time of junction and reinforces connection part after connection, is also possibly used.

EXAMPLE 4

Referring to a fourth example of the present invention, a producing method for a semiconductor element will next be explained in conjunction with FIG. 2. First, silicon oxide is deposited all over the semiconductor substrate 1, and the cover film 3 is formed. A part thereof is removed and the surface of an electrode 2 made from aluminum alloy is exposed, before sputtering of the copper film is carried out in an orderly manner, determining titanium as an interconnected film 4, and determining copper film as an adhesive film 5. The interconnected film and the adhesive film are thus formed on the whole surface. The thickness of the cover coat is set as 4.5 μm, the thickness of the interconnected film is set as 60 nm, and the thickness of the adhesive film is set as 500 nm. Next, the plating resist film 19 was formed and copper was deposited by electrolytic plating to obtain a columnar bump 6. The size of the columnar bump is set as about 140 μm in diameter, and about 90 μm in height. Subsequently, a cap film 8 of about 5 μm thickness is continuously formed on the columnar bump upper surface by gold-plating. Then, plating resist is exfoliated and unnecessary portions of an interconnected film and an adhesive film are removed by wet etching, using a copper bump as a mask. Wet prevention film is not formed in this example.

A packaging process onto a wiring substrate of a semiconductor element having a copper bump will next be explained in conjunction with FIG. 34. In this embodiment, a cap film 8 (gold plating film) is formed on a pad 14 of a wiring substrate 12, also. Just before carrying a semiconductor element onto a wiring substrate, argon plasma cleaning is carried out to a semiconductor element and a wiring substrate. The semiconductor element and the wiring substrate are aligned thereafter, and the semiconductor element is carried onto the wiring substrate. Then, the load of about five to 50 gf (0.049-0.49 N) per bump is applied, and simultaneously heated at 350 degrees, so that a junction between a bump and a pad may be achieved. Here, there is no necessity of cleaning since flux is not used. Immediately after this, underfill resin is poured in from the side, to obtain a cured resin after filling.

As in the foregoing, since connection to a pad on a wiring substrate is carried out using a small amount of solder or without using solder, alpha dose leading to a soft error can be reduced, and improvement in reliability can be aimed at. Also, since the part joined to solder of a columnar bump is limited to the upper surface of the columnar bump, or the bump side surface in the vicinity of the upper surface. Whereby, the diameter of the bump is not needed to be thick even if a bump becomes high, and the distance between the semiconductor board and the wiring substrate can be secured, responding to high pin count. Accordingly, even if high-density tendency of LSI advances according to this invention, filling of underfill resin can be easily and reliably carried out. In addition, according to this invention solder does not get wet upwardly as far as the base of the columnar bump resulting in junction intensity fall between the columnar bump and the adhesive film, or between the adhesive film and the interconnected film. Improvement in reliability can thus be aimed at.

Since a columnar bump of this invention is formed by the electrolytic plating method etc. in a wafer stage, manufacture at low cost compared with a solder ball loading method is possible. Also, according to an embodiment which uses the thermosetting resin (activity resin) which has the flux activity effect instead of the flux used at the time of flip chip mounting, improvement in reliability by low cost by cleaning process reduction and an elimination of cleaning residual substance, is realized.

What is claimed is:

1. A method of producing a semiconductor element, comprising the steps of:
    forming a metal film serving as a plating electrode on the whole part of a semiconductor substrate having an electrode formed thereon;
    forming a resist film having an opening in the position of said electrode on said metal film;
    depositing a high conductivity metal in columnar form to form a columnar projection by electrolytic plating;
    removing said resist film;
    etching to remove said metal film by using said columnar projection as a mask; and
    forming a wet prevention film on the surface of said columnar projection.

2. The method of producing a semiconductor element as set forth in claim 1, wherein after forming of said wet prevention film on the surface of said columnar projection, said wet prevention film on the part of said columnar projection connected to a packaging substrate is removed.

3. A method of producing a semiconductor element, comprising the steps of:
    forming a resist film having an opening in the position of said electrode on a semiconductor substrate having an electrode thereon;
    forming an activation processing layer by activation processing to electroless plating;
    removing said activation layer on the said resist film;
    depositing highly conductive metal in said opening by electroless plating to form a columnar projection;
    removing said resist film; and
    forming a wet prevention film on the surface of said columnar projection, wherein after forming of said wet prevention film on the surface of said columnar projection, said wet prevention film on the part of said columnar projection connected to a packaging substrate is removed.

4. The method of producing a semiconductor element as set forth in claim 1, wherein before forming of a wet prevention film on the surface of said columnar projection, a mask is formed on a region of said columnar projection where said wet prevention film should not be formed, and after forming of a wet prevention film on the surface of said columnar projection, said mask is removed.

5. A method of producing a semiconductor element, comprising the steps of:
    forming a resist film having an opening in the position of said electrode on a semiconductor substrate having an electrode thereon;
    forming an activation processing layer by activation processing to electroless plating;
    removing said activation layer on the said resist film;
    depositing highly conductive metal in said opening by electroless plating to form a columnar projection;
    removing said resist film; and
    forming a wet prevention film on the surface of said columnar projection, wherein before forming of a wet prevention film on the surface of said columnar projection, a mask is formed on a region of said columnar projection where said wet prevention film should not be formed, and after forming of a wet prevention film on the surface of said columnar projection, said mask is removed.

6. The method of producing a semiconductor element as set forth in claim 1, wherein said wet prevention film is a silicon oxide film or a silicon nitride film deposited by a CVD method.

7. A method of producing a semiconductor element, comprising the steps of:
    forming a resist film having an opening in the position of said electrode on a semiconductor substrate having an electrode thereon;
    forming an activation processing layer by activation processing to electroless plating;
    removing said activation layer on the said resist film;
    depositing highly conductive metal in said opening by electroless plating to form a columnar projection;
    removing said resist film; and
    forming a wet prevention film on the surface of said columnar projection, wherein said wet prevention film is a silicon oxide film or a silicon nitride film deposited by a CVD method.

8. The method of producing a semiconductor element as set forth in claim 1, wherein said forming of said wet prevention film on the surface of said columnar projection is exposing said columnar projection to oxidizing atmosphere to form an oxide film on the surface of said columnar projection.

9. A method of producing a semiconductor element, comprising the steps of:
    forming a resist film having an opening in the position of said electrode on a semiconductor substrate having an electrode thereon;
    forming an activation processing layer by activation processing to electroless plating;
    removing said activation layer on the said resist film;
    depositing highly conductive metal in said opening by electroless plating to form a columnar projection;
    removing said resist film; and
    forming a wet prevention film on the surface of said columnar projection, wherein said forming of said wet prevention film on the surface of said columnar projection is exposing said columnar projection to oxidizing atmosphere to form an oxide film on the surface of said columnar projection.

10. The method of producing a semiconductor element as set forth in claim 2, wherein said removing of said wet prevention film in the connection part of said columnar projection corresponds to exposing said columnar projection to plasma of inactive gas.

11. The method of producing a semiconductor element as set forth in claim 1, wherein after forming of said columnar projection and before removing said resist film, a solder film is coated on the upper surface of said columnar projection.

12. The method of producing a semiconductor element as set forth in claim 1, comprising the steps of; after forming of said columnar projection and before removing of said resist film,
    exposing the upper portion of side surface of said columnar projection by applying half-etching onto said resist film; and
    coating the upper surface and the upper portion of side surface with solder film.

* * * * *